(12) United States Patent
Huang et al.

(10) Patent No.: US 11,335,666 B2
(45) Date of Patent: May 17, 2022

(54) MEMORY DEVICE AND MANUFACTURING METHOD THEREOF

(71) Applicant: Taiwan Semiconductor Manufacturing Co., Ltd., Hsinchu (TW)

(72) Inventors: Ching-Yu Huang, Hsinchu (TW); Han-Ping Pu, Taichung (TW); Ming-Kai Liu, Hsinchu (TW); Ting-Chu Ko, Hsinchu (TW); Yung-Ping Chiang, Hsinchu County (TW); Chang-Wen Huang, Hsinchu (TW); Yu-Sheng Hsieh, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 13 days.

(21) Appl. No.: 16/924,192

(22) Filed: Jul. 9, 2020

(65) Prior Publication Data
US 2022/0013494 A1  Jan. 13, 2022

(51) Int. Cl.
*H01L 25/065* (2006.01)
*H01L 25/18* (2006.01)
(Continued)

(52) U.S. Cl.
CPC ...... *H01L 25/0652* (2013.01); *H01L 23/3731* (2013.01); *H01L 24/19* (2013.01);
(Continued)

(58) Field of Classification Search
CPC ..... H01L 25/0652; H01L 24/19; H01L 24/20; H01L 25/18; H01L 25/50;
(Continued)

(56) References Cited

U.S. PATENT DOCUMENTS 8,993,380 B2  3/2015  Hou et al.
9,281,254 B2  3/2016  Yu et al.
(Continued)

*Primary Examiner* — Thanh Y. Tran
(74) *Attorney, Agent, or Firm* — JCIPRNET

(57) ABSTRACT

A memory device including a first semiconductor die and a memory cube mounted on and connected with the first semiconductor die is described. The memory cube includes multiple stacked tiers, and each tier of the multiple stacked tiers includes second semiconductor dies laterally wrapped by an encapsulant and a redistribution structure disposed on the second semiconductor dies and the encapsulant. The second semiconductor dies of the multiple stacked tiers are electrically connected with the first semiconductor die through the redistribution structures in the multiple stacked tiers. Each redistribution structure in the multiple stacked tiers includes redistribution patterns, the redistribution structure closest to the first semiconductor die further includes a thermally conductive layer connected to the first semiconductor die, wherein a material of the redistribution patterns in the multiple stacked tiers is different from a material of the thermally conductive layer of the redistribution structure closest to the first semiconductor die, and the thermally conductive layer is electrically isolated from the second semiconductor dies in the multiple stacked tiers and the first semiconductor die.

16 Claims, 15 Drawing Sheets

(51) Int. Cl.
    *H01L 23/00*     (2006.01)
    *H01L 23/373*     (2006.01)
    *H01L 25/00*     (2006.01)

(52) U.S. Cl.
    CPC .............. *H01L 24/20* (2013.01); *H01L 25/18* (2013.01); *H01L 25/50* (2013.01); *H01L 2224/214* (2013.01); *H01L 2225/06524* (2013.01); *H01L 2225/06548* (2013.01); *H01L 2225/06586* (2013.01); *H01L 2225/06589* (2013.01)

(58) Field of Classification Search
    CPC . H01L 2225/06524; H01L 2225/06548; H01L 2225/06586; H01L 2225/06589
    See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2017/0358557 A1* | 12/2017 | Chen ................... H01L 25/50 |
| 2020/0075561 A1* | 3/2020 | Kim .................... H01L 23/3128 |
| 2021/0043532 A1* | 2/2021 | Yuan ................... H01L 23/34 |
| 2021/0118847 A1* | 4/2021 | Chuang ............... H01L 25/18 |

\* cited by examiner

MEMORY DEVICE AND MANUFACTURING METHOD THEREOF

BACKGROUND

As size downscaling and operation speed increasing, the thermal dissipation for highly integrated semiconductor packaging is an important issue and has great impact on the performance of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
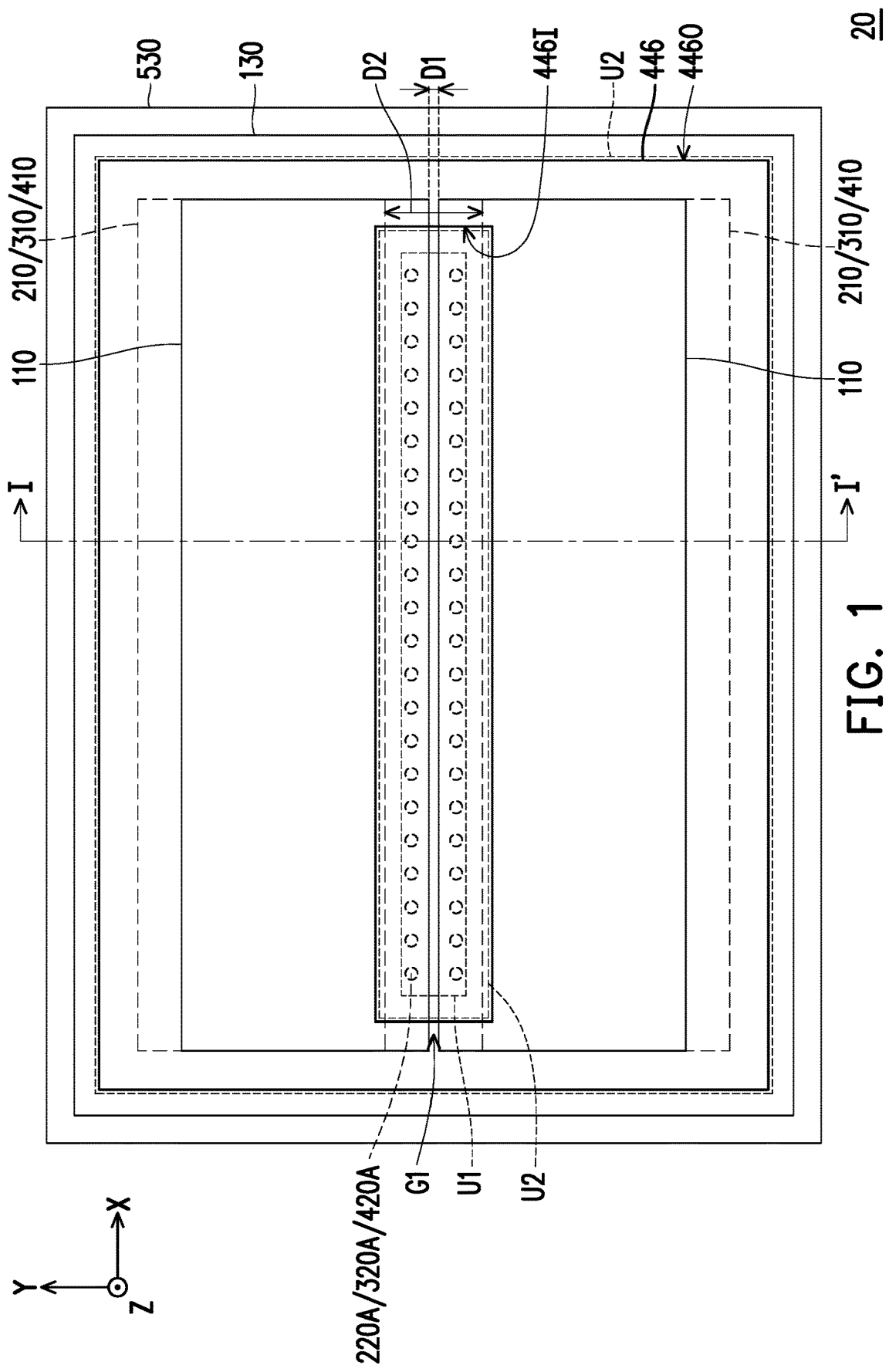
FIG. 1 is a schematic top view of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic top view of a memory device 20 according to some embodiments of the present disclosure, having a cross-section line I-I' in a direction Y. FIG. 2A to FIG. 2I are schematic cross-sectional views of structures produced at various stages of a manufacturing method of a memory device 20 according to some embodiments of the present disclosure. FIG. 1 show the exemplary structure of the memory device 20 produced through the manufacturing method shown from FIG. 2A to FIG. 2I. FIG. 2A to FIG. 2I are schematic cross-sectional views taken along the cross-section line I-I' of FIG. 1. The top view of FIG. 1 mainly shows the relative positional relationships for the through insulator vias 220A, 320A, 420A, the semiconductor dies 110, 210, 310, 410 and the thermally conductive layer 446 in the singulated packaging unit PU. Therefore, for simplicity and clarity of illustration, some elements of the memory device 20 are omitted in the simplified top view of FIG. 1.

Figure 2A:
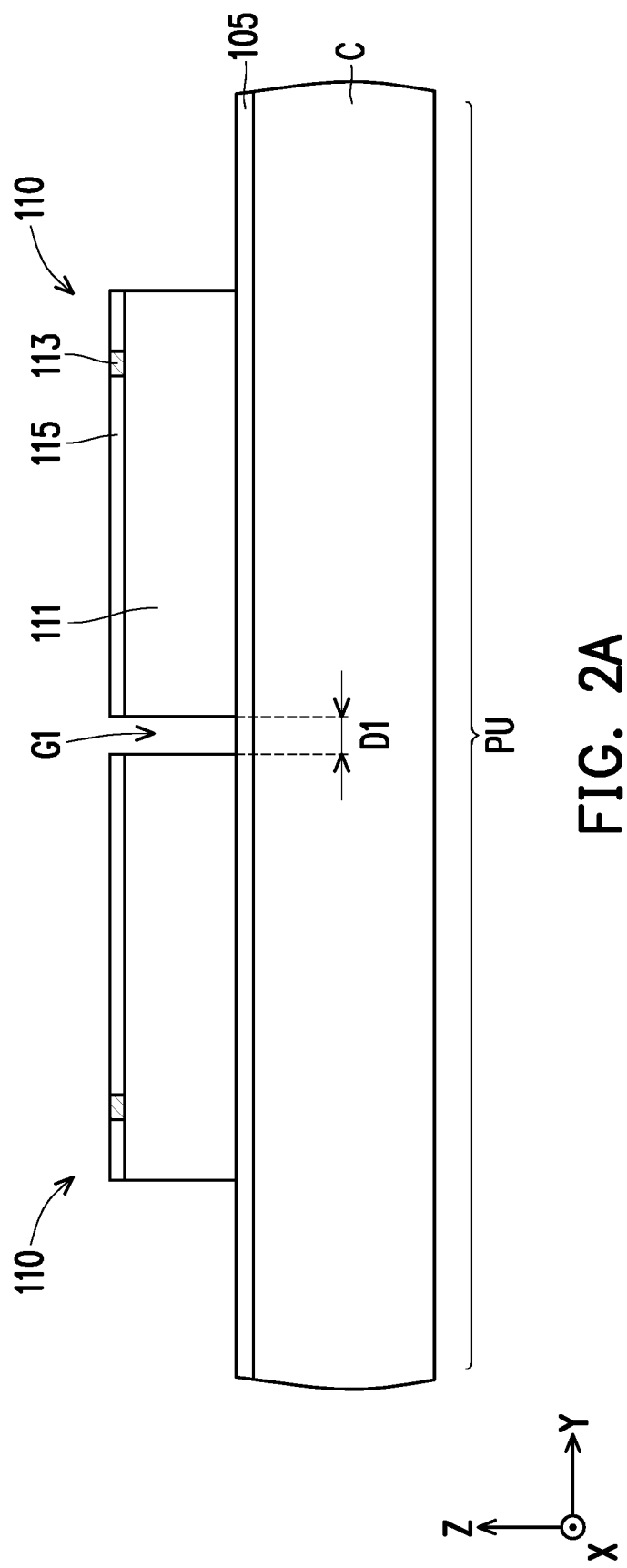
FIG. 2A to FIG. 2I are schematic cross-sectional views of structures produced at various stages of a manufacturing method of a memory device according to some embodiments of the present disclosure.

Referring to FIG. 1 and FIG. 2A, a carrier C is provided. In some embodiments, the carrier C is a glass substrate, a metal plate, a plastic supporting board or the like, but other suitable substrate materials may be used as long as the materials are able to withstand the subsequent steps of the process. In some embodiments, a de-bonding layer (not shown) is provided on the carrier C to facilitate peeling the carrier C away from the structure when required by the manufacturing process. In some embodiments, the de-bonding layer may include a light-to-heat conversion (LTHC) release layer.

In some embodiments, referring to FIG. 1 and FIG. 2A, semiconductor dies 110 are provided on the carrier C. Herein, semiconductor dies and semiconductor chips may be used interchangeably and refer to dies or chips having semiconductor integrated circuits (ICs), or hybrid integrated circuits with passive components. In some embodiments, the semiconductor dies 110 are placed onto the carrier C through a pick-and-place method and are fixed to the carrier C through a die attach film (DAF) 105. In some embodiments the semiconductor dies 110 are placed over the carrier C with their top surfaces facing away from the carrier C and their bottom surfaces attached to the carrier C through the DAF 105. As shown in FIG. 2A, the DAF 105 is blanketly formed over the carrier C. However, the disclosure is not limited thereto. In some alternative embodiments, the die attach film 105 may only be formed between the carrier C and the semiconductor dies 110. In some embodiments, two semiconductor dies 110 are arranged as one packaging unit PU using wafer-level packaging technology. Even though only two semiconductor dies 110 are presented in FIG. 2A for illustrative purposes, less or more than two semiconductor dies 110 may be provided within the packaging unit PU on the carrier C. And, although only one packaging unit PU is presented in FIG. 2A for illustrative purposes, those skilled in the art can understand that more than one packaging unit PU arranged in an array may be provided on the carrier C. In some embodiments, an individual semiconductor die 110 includes a semiconductor substrate 111, at least one contact 113, and a protective layer 115. In some embodiments, the semiconductor substrate 111 is made of elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 111 includes active components (e.g., transistors and/or memories such as N-type metal-oxide semiconductor (NMOS) and/or P-type metal-oxide semiconductor (PMOS) devices, or the like) and optionally passive components (e.g., resistors, capacitors, inductors or the like) formed therein. In some embodiments, such active components and passive components may be formed in a front-end-of-line (FEOL) process.

In some embodiments, as shown in FIG. 2A, the contact 113 is formed on the illustrated top surface of the semiconductor substrate 111. In some embodiments, the material of the contact 113 includes copper, copper alloys, or other conductive materials, and may be formed by deposition, plating, or other suitable techniques. Although FIG. 2A illustrates that each semiconductor die 110 includes one contact 113, it should be noted that the number of the contact 113 formed on the semiconductor substrate 111 is not limited thereto, and this can be adjusted based on demand and/or design layout.

In some embodiments, as shown in FIG. 2A, the protective layer 115 covers the illustrated top surface of the semiconductor substrate 111 but exposes the contact 113. In some embodiments, the material of the protective layer 115 may include silicon oxide ($SiO_x$, where x>0), silicon nitride ($SiN_x$, where x>0), silicon oxynitride ($SiO_xN_y$, where x>0 and y>0), other suitable dielectric materials, or combinations thereof. As shown in FIG. 2A, the protective layer 115 is a single layer. However, the disclosure is not limited thereto. In some alternative embodiments, the protective layer 115 may be a multi-layered structure.

In some embodiments, the semiconductor die 110 is a memory die, such as a dynamic random access memory (DRAM), a resistive random access memory (RRAM), a static random access memory (SRAM), a magneto-resistive random access memory (MRAM), or a ferroelectric random access memory (FRAM).

In some embodiments, as shown in FIG. 2A, the two semiconductor dies 110 (as a pair) are disposed on the carrier C side-by-side with a gap G1 there-between, and the two semiconductor dies 110 are spaced apart with a distance D1 along the direction Y. In other words, the distance D1 is measured between two facing sides of the semiconductor dies 110, and also is measured between two opposite sidewalls of the gap G1. In some embodiments, each semiconductor die 110 has a rectangular shape, and the semiconductor dies 110 (as a pair) are arranged with the long sides in parallel with each other, i.e., the facing sides of the semiconductor dies 110 are the long sides. From the top view of FIG. 1, except for the two long sides of the semiconductor dies 110 facing each other (with distance D1) being the facing sides, the other sides of the group of semiconductor dies 110 are considered as non-facing sides. In some embodiments, the distance D1 ranges from about 60 microns to about 100 microns.

Figure 2B:
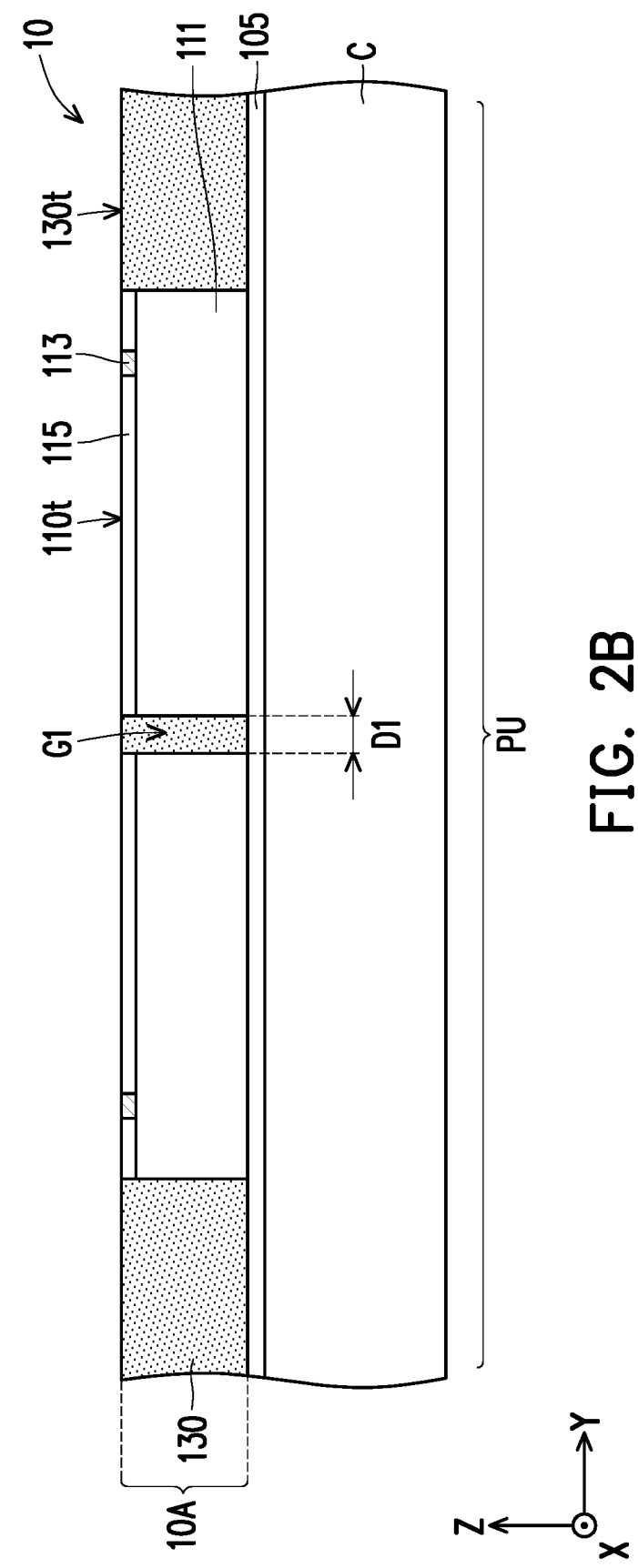

Referring to FIG. 2B, an encapsulant 130 is formed over the carrier C and surrounding the semiconductor dies 110. In some embodiments, as seen in FIG. 2B, the encapsulant 130 laterally encapsulates the semiconductor dies 110. In other words, the encapsulant 130 covers and wrap around the sidewalls of the semiconductor dies 110. Further, as shown in FIG. 2B, the encapsulant 130 is formed to fill the gap G1 between the semiconductor dies 110. In some embodiments, the encapsulant 130 may be referred to as "gap-fill material". In some embodiments, the encapsulant 130 is formed by forming an encapsulating material (not shown) over the carrier C fully covering the semiconductor dies 110, and then performing a planarization process on the encapsulating material to expose the illustrated top surfaces 110t of the semiconductor dies 110. In some embodiments, the encapsulating material of the encapsulant 130 includes a molding compound, a molding underfill, a resin (such as epoxy resin, phenolic resin), or the like. In some alternative embodiments, the encapsulating material of the encapsulant 130 include silicon oxide ($SiO_x$, where x>0), silicon oxynitride ($SiO_xN_y$, where x>0 and y>0), silicon nitride ($SiN_x$, where x>0), or other suitable dielectric material. In some embodiments, the encapsulating material of the encapsulant 130 may further include filler particles (e.g., silica, clay or the like). In some embodiments, the encapsulating material of the encapsulant 130 is formed through an over-molding process. For example, the over-molding process is a compression molding process. In some alternative embodiments, the encapsulating material of the encapsulant 130 is formed through a film deposition process. For example, the film deposition process includes chemical vapor deposition (CVD), High-Density Plasma Chemical Vapor Deposition (HDPCVD), plasma-enhanced chemical vapor deposition (PECVD), atomic layer deposition (ALD), or combinations thereof. In some embodiments, the planarization process includes a mechanical grinding process, a chemical mechanical polishing (CMP) process, or combinations thereof.

As shown in FIG. 2B, in some embodiments, after the planarization process is performed on the encapsulating material, the illustrated top surface 130t of the encapsulant 130 is substantially levelled with and coplanar with the illustrated top surfaces 110t of the semiconductor dies 110. Also, as shown in FIG. 2B, after the planarization process is performed on the encapsulating material, the contacts 113 of the semiconductor dies 110 are exposed and available for electrically connecting the semiconductor dies 110 to subsequently formed components or elements. In some embodiments, the illustrated top surfaces 110t of the semiconductor dies 110 are referred as active surfaces of the semiconductor dies 110.

In some embodiments, through the formation of the encapsulant 130, the semiconductor dies 110 are all molded into a molded structure 10 (similar to a reconstructed wafer structure), and the molded structure 10 includes multiple packaging units PU. In other words, the exemplary processes may be performed at a reconstructed wafer level, so that the multiple units PU are processed in the form of a reconstructed wafer. In the cross-sectional views shown from FIG. 2A to FIG. 2I, one packaging unit PU is shown for simplicity, but the disclosure is not limited by the embodiments or figures shown herein. In some embodiments, the semiconductor dies 110 and the encapsulant 130 which laterally surrounds the semiconductor dies 110 are considered as parts of a tier 10A (described hereinafter) of the molded structure 10.

Figure 2C:
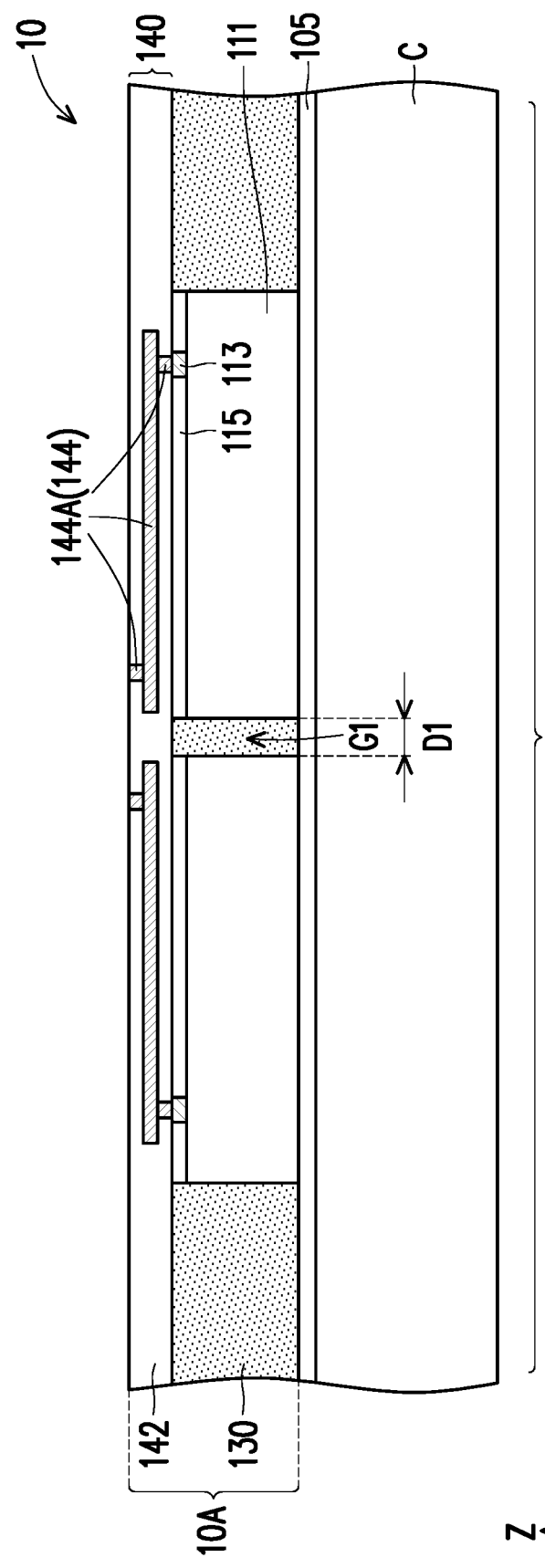

Referring to FIG. 2C, a redistribution structure 140 is formed on the semiconductor dies 110 and the encapsulant 130. In some embodiments, as shown in FIG. 2C, the redistribution structure 140 includes a dielectric layer 142 and a redistribution conductive layer 144. For simplicity, the dielectric layer 142 is illustrated as a single bulky layer in FIG. 2C, but it should be understood that the dielectric layer 142 may be constituted by multiple dielectric layers, and the number of the dielectric layers in the dielectric layer 142 may be adjusted depending on product requirement. In some embodiments, the redistribution conductive layer 144 is embedded in the dielectric layer 142. In some embodiments, the redistribution conductive layer 144 includes multiple layers of redistribution patterns 144A that are electrically connected with the underlying semiconductor dies 110. In some embodiments, the redistribution patterns 144A include conductive wirings extending horizontally and conductive vias extending vertically through the dielectric layer 142 to establish electrical connection between the layers of the conductive wirings. It should be noted that the number of layers of redistribution patterns 144A in the redistribution conductive layer 144 described herein are merely for illustrative purposes, and the disclosure is not limited thereto. Further, although only the redistribution patterns 144A electrically connected with the underlying semiconductor dies 110 are illustrated herein, those skilled in the art should understand that the redistribution conductive layer 144 may further include multiple layers of dummy patterns which are electrically floating and have no signal-transmitting function within the spans of the underlying semiconductor dies 110. That is to say, the dummy patterns of the redistribution conductive layer 144 within the spans of the underlying semiconductor dies 110 are electrically isolated from the underlying semiconductor dies 110. Herein, when elements are described as "dummy", the elements are electrically floating or electrically isolated from other elements. When the redistribution structure 140 is formed, the tier 10A of the molded structure 10 is formed. That is to say, the redistribution structure 140 is also referred to as the tier redistribution layer (RDL) structure of the tier 10A.

In some embodiments, the redistribution conductive layer 144 is made of a metal or metallic material, such as aluminum, titanium, copper, nickel, tungsten, silver, gold, combinations or alloys thereof. In certain embodiments, the material of the redistribution conductive layer 144 includes copper or copper alloys. The redistribution conductive layer 144 may be formed by, for example, electroplating, deposition, and/or photolithography and etching. In certain embodiments, the redistribution conductive layer 144 is formed by dual-damascene process. In alternative embodiments, the redistribution conductive layer 144 is formed by multiple single damascene processes. In some embodiments, the material of the dielectric layer 142 includes polyimide (PI), benzocyclobutene (BCB), polybenzooxazole (PBO), a nitride such as silicon nitride ($SiN_x$, where x>0), an oxide such as silicon oxide ($SiO_x$, where x>0), PSG, BSG, BPSG, a combination thereof or the like. The dielectric layer 142, for example, may be formed by suitable fabrication techniques such as spin-on coating, CVD, HDPCVD, PECVD, or the like.

Figure 2D:
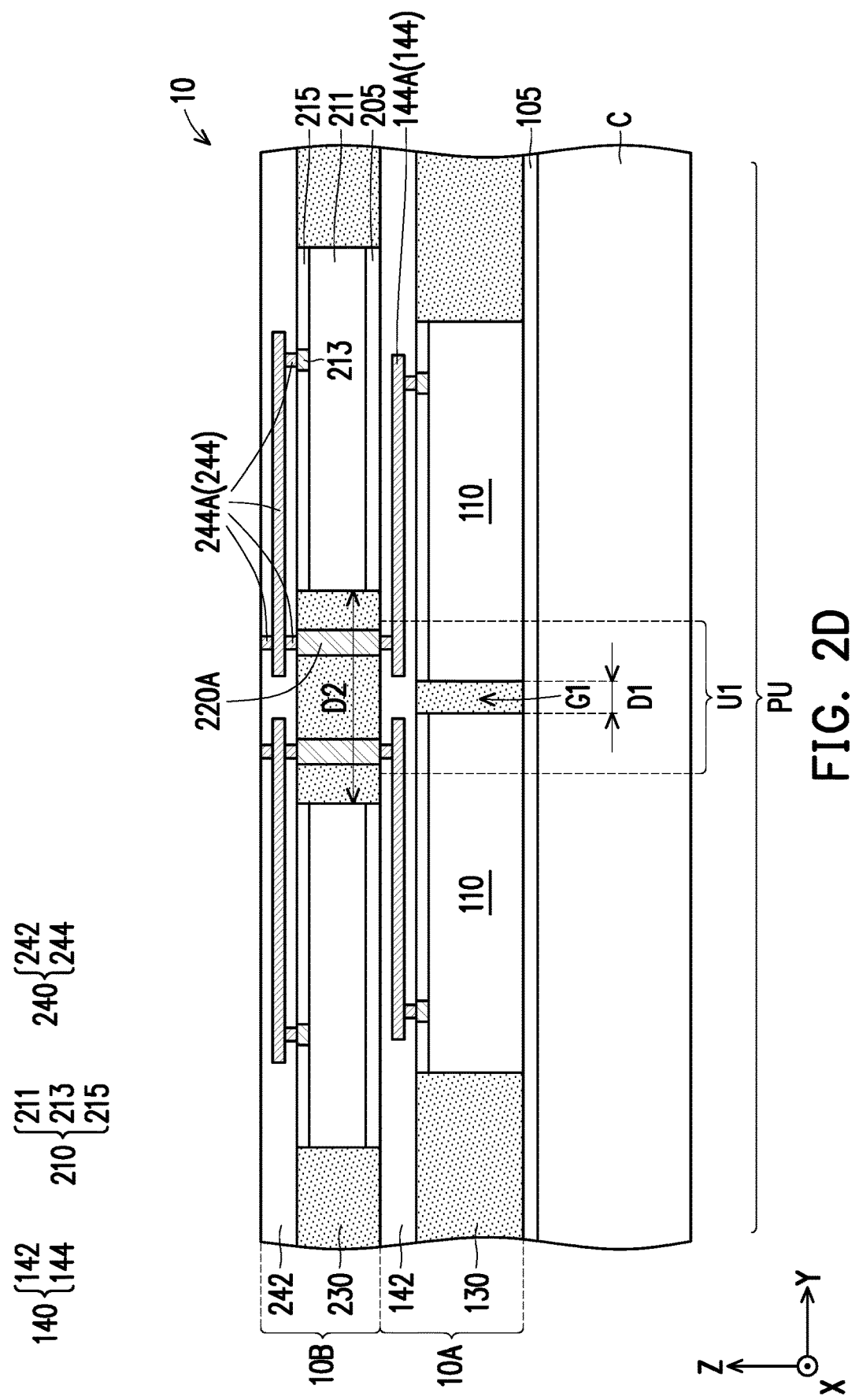

Referring to FIG. 2D, following the formation of the tier 10A, a tier 10B of the molded structure 10 is formed and stacked over the tier 10A along a stacking direction Z perpendicular to the direction Y. In some embodiments, as shown in FIG. 2D, the tier 10B includes semiconductor dies 210, through insulator vias (TIVs) 220A, an encapsulant 230, and a redistribution structure 240. In some embodiments, after forming the redistribution structure 140, the through insulator vias 220A are formed on the redistribution structure 140. In some embodiments, the through insulator vias 220A are of substantially the same dimensions. In some embodiments, the through insulator vias 220A are formed on and connected with the redistribution patterns 144A of the redistribution conductive layer 144. In some embodiments, as shown in FIG. 1 and FIG. 2D, the through insulator vias 220A are formed right above the underlying semiconductor dies 110. That is to say, along the stacking direction Z, the vertical projection of each of the through insulator vias 220A falls within the span of the vertical projection of the corresponding semiconductor die 110. In some embodiments, as shown in FIG. 1 and FIG. 2D, the through insulator vias 220A located right above one semiconductor die 110 are separate from one another and arranged as an array (i.e., a row) alongside the sidewall of the gap G1. It should be noted that even though one row of the through insulator vias 220A located right above one semiconductor die 110 is presented in FIG. 1 and FIG. 2D for illustrative purposes, more than one row of the through insulator vias 220A located right above one semiconductor die 110 may be provided over the redistribution structure 140. In some embodiments, along the stacking direction Z, the vertical projections of the through insulator vias 220A are not overlapped with the gap G1. As illustrated in FIG. 1, the top view of the through insulator via 220A exhibits a circular shape. In other words, a cross-section of the through insulator via 220A parallel to the illustrated top surface 110t (as shown in FIG. 2B) of the semiconductor die 110 is a circle. However, the disclosure is not limited thereto. In some alternative embodiments, the top view of the through insulator via 220A may exhibit an elliptical shape, a polygonal shape or other suitable shapes.

In one embodiment, the formation of the through insulator vias 220A includes forming a mask pattern (not shown) with openings, then forming a conductive material (not shown) filling up the openings by electroplating or deposition, and removing the mask pattern to form the through insulator vias 220A on the redistribution structure 140. In an alternative embodiment, the through insulator vias 220A may be formed by forming a seed layer (not shown) on the redistribution structure 140; forming the mask pattern (not shown) with openings exposing portions of the seed layer; forming the conductive material (not shown) on the exposed portions of the seed layer to form the through insulator vias 220A by plating; removing the mask pattern; and then removing portions of the seed layer exposed by the through insulator vias 220A. In some embodiments, the material of the mask pattern may include a positive photo-resist or a negative photo-resist. In some embodiments, the conductive material of the through insulator vias 220A includes a metal or metallic material, such as aluminum, titanium, copper, nickel, tungsten, silver, gold, combinations or alloys thereof. In certain embodiments, the conductive material of the through insulator vias 220A includes copper or copper alloys. In some embodiments, the seed layer is a titanium/copper composited layer.

After the through insulator vias 220A are formed, the semiconductor dies 210 are disposed on the redistribution structure 140. In some embodiments, the semiconductor dies 210 are placed onto the redistribution structure 140 through a pick-and-place method and are fixed to the redistribution structure 140 through a DAF 205. In some embodiments the semiconductor dies 210 are placed over the redistribution structure 140 with their top surfaces facing away from the redistribution structure 140 and their bottom surfaces attached to the redistribution structure 140 through the DAF 105. As shown in FIG. 2D, the DAF 205 is located only between the redistribution structure 140 and the semiconductor dies 210. In some embodiments, the semiconductor die 210 is a memory die, such as a DRAM, a RRA, a SRAM, a MRAM, or a FRAM. In some embodiments, the semiconductor dies 210 have substantially the same functions as the semiconductor dies 110. In some alternative embodiments, the semiconductor dies 210 may have different functions from the semiconductor dies 110. In some embodiments, the semiconductor dies 210 and the semiconductor dies 110 are of about the same dimensions/sizes.

In some embodiments, as shown in FIG. 2D, an individual semiconductor die 210 includes a semiconductor substrate 211, at least one contact 213, and a protective layer 215. These elements of the semiconductor die 210 are similar to the semiconductor substrate 111, the contact 113 and the protective layer 115 of the semiconductor die 110, hence the detailed descriptions (e.g. the materials, formation processes, positioning configurations, etc.) of the said elements of the semiconductor die 210 are referred thereto.

As seen in FIG. 1 and FIG. 2D, within one packaging unit PU, two semiconductor dies 210 (shown in dotted lines in FIG. 1) are provided side-by-side as a pair spaced apart from each other with a distance D2 along the direction Y. In other words, the distance D2 is measured between two facing sides of the semiconductor dies 210. In some embodiments, each semiconductor die 210 has a rectangular shape, and the semiconductor dies 210 (as a pair) are arranged with the long sides in parallel with each other, i.e., the facing sides of the semiconductor dies 210 are the long sides. In some embodiments, the distance D2 ranges from about 500 microns to about 2000 microns. In some embodiments, the distance D2 is larger than the distance D1. That is to say, when the semiconductor dies 210 and the semiconductor dies 110 are of about the same dimensions/sizes, from the top view, the sides of the semiconductor dies 210 extending along a direction X perpendicular to the direction Y and the stacking direction Z are not vertically aligned with the sides of the semiconductor dies 110 extending along the direction X, but the sides of the semiconductor dies 210 extending along the direction Y are vertically aligned with the sides of the semiconductor dies 110 extending along the direction Y. In other words, along the stacking direction Z, the semiconductor dies 210 of the tier 10B partially overlap with corresponding underlying semiconductor dies 110 of the tier 10A.

As seen in FIG. 1 and FIG. 2D, within one packaging unit PU, the pair of semiconductor dies 210 are spaced apart from the through insulator vias 220A and are located beside the array of the through insulator vias 220A. In detail, the array of the through insulator vias 220A electrically connected with the underlying redistribution patterns 144A are located between the two facing sides (i.e., the two long sides) of the semiconductor dies 210 and are spaced apart from the semiconductor dies 210. With such configuration, the number of the through insulator vias 220A in tier 10B may be determined based on the spacing there-between, the distance D2 between the semiconductor chips 210, and the gap G1 between the semiconductor chips 110 in the tier 10A. As such, it should be noted that the number of the through insulator vias 220A described herein is merely for illustrative purposes, and may be varied at least depending on the design of redistribution patterns 144A in the redistribution conductive layer 144.

Continued on FIG. 2D, the encapsulant 230 is formed on the redistribution structure 140 laterally wrapping the semiconductor dies 210 and the through insulator vias 220A. Further, as shown in FIG. 2D, the encapsulant 230 is formed to fill the gap between the semiconductor dies 210, the gap between the through insulator vias 220A, and the gap between the semiconductor dies 210 and the through insulator vias 220A. In some embodiments, the encapsulant 230 may be referred to as "gap-fill material". The material and the manufacturing process of the encapsulant 230 are similar to those described above for the encapsulant 130. Therefore, for details or descriptions of the encapsulant 230 not iterated herein, please refer to the aforesaid details or descriptions mentioned for the encapsulant 130.

After the encapsulant 230 is formed, the redistribution structure 240 is formed on the encapsulant 230, the semiconductor dies 210, and the through insulator vias 220A. In some embodiments, as shown in FIG. 2D, the redistribution structure 240 includes a dielectric layer 242 and a redistribution conductive layer 244 embedded in the dielectric layer 242. In some embodiments, the redistribution conductive layer 244 includes multiple layers of redistribution patterns 244A that are electrically connected with the underlying semiconductor dies 210 and the underlying through insulator vias 220A. In detail, the semiconductor dies 210 are electrically connected with the semiconductor dies 110 through the redistribution patterns 244A of the redistribution conductive layer 244, the through insulator vias 220A, and the redistribution patterns 144A of the redistribution conductive layer 144. That is to say, the through insulator vias 220A establish electrical connections between the redistribution structures 140 and 240 and, consequently, between the semiconductor dies 110 and 210. In other words, along the stacking direction Z, the through insulator vias 220A, portions of the redistribution patterns 144A of the redistribution conductive layer 144, and portions of the redistribution patterns 244A of the redistribution conductive layer 244 provide a vertical signal path between the tier 10A and the tier 10B. Due to such configuration, a region where the through insulator vias 220A are located is referred to as a vertical signal transmission region U1 (shown in dotted lines in FIG. 1) of the packaging unit PU. In some embodiments, as shown in FIG. 1 and FIG. 2D, within one packaging unit PU, the vertical signal transmission region U1 (shown in dotted lines in FIG. 1) is located between the semiconductor dies 210. As mentioned above, the through insulator vias 220A in the tier 10B are formed right above the underlying semiconductor dies 110 in the tier 10A, and thus portions of the semiconductor dies 110 are located within the vertical signal transmission region U1. Further, depending on the signal transmission requirements, it is understood that the arrangement of the through insulator vias 220A presented in FIG. 1 and FIG. 2D is merely for illustrative purposes, and other arrangement may be adapted to the through insulator vias 220A as long as the through insulator vias 220A are designed to be disposed within the vertical signal transmission region U1 and electrically connected with the underlying redistribution patterns 144A. The material and the manufacturing process of the dielectric layer 242 and the redistribution conductive layer 244 are similar to those described above for the dielectric layer 142 and the redistribution conductive layer 144. Therefore, for details or descriptions of the dielectric layer 242 and the redistribution conductive layer 244 not iterated herein, please refer to the aforesaid details or descriptions mentioned for the dielectric layer 142 and the redistribution conductive layer 144.

Figure 2E:
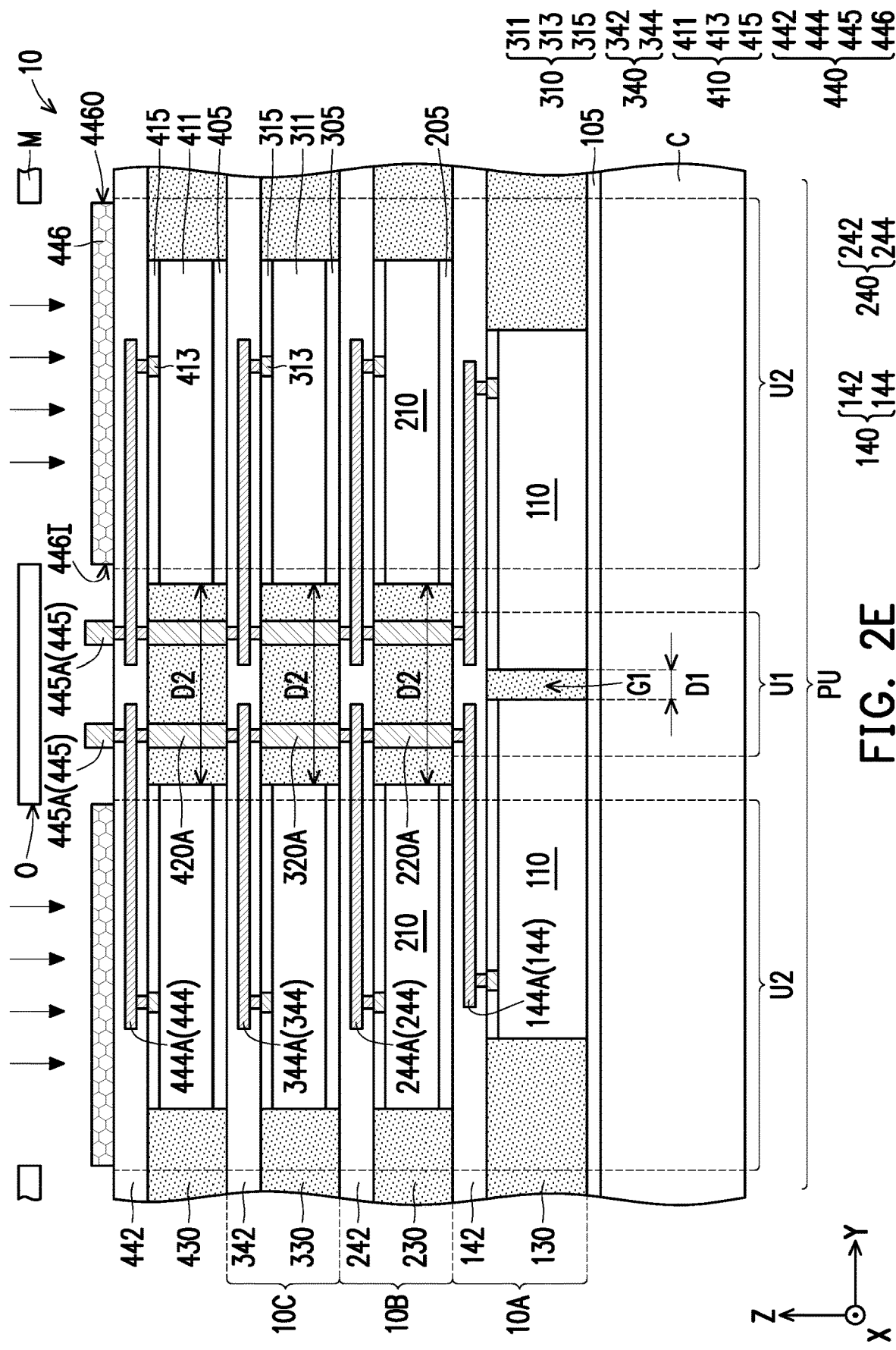

Referring to FIG. 2E, following the formation of the tier 10B, a tier 10C (or additional tiers) of the molded structure 10 may be sequentially formed on the tier 10B along the stacking direction Z following similar manufacturing process steps of the tier 10B. In some embodiments, as shown in FIG. 2E, the tier 10C includes semiconductor dies 310, through insulator vias (TIVs) 320A, an encapsulant 330, and a redistribution structure 340. In some embodiments, after forming the redistribution structure 240, the through insulator vias 320A are formed on the redistribution structure 240. In some embodiments, the through insulator vias 320A are of substantially the same dimensions. In some embodiments, the through insulator vias 320A are formed on and connected with the redistribution patterns 244A of the redistribution conductive layer 244. In some embodiments, as shown in FIG. 1 and FIG. 2E, along the stacking direction Z, the through insulator vias 320A are vertically aligned with the through insulator vias 220A. However, the disclosure is not limited thereto. In some alternative embodiments, along the stacking direction Z, the through insulator vias 320A are staggered with the through insulator vias 220 A. In some embodiments, as shown in FIG. 1 and FIG. 2E, the through insulator vias 320A located right above one semiconductor die 110 are separate from one another and arranged as an array (i.e., a row) alongside the sidewall of the gap G1. It should be noted that even though one row of the through insulator vias 320A located right above one semiconductor die 110 is presented in FIG. 1 and FIG. 2E for illustrative purposes, more than one row of the through insulator vias 320A located right above one semiconductor die 110 may be provided over the redistribution structure 240. In some embodiments, along the stacking direction Z, the vertical projections of the through insulator vias 320A are not overlapped with the gap G1. The material and the manufacturing process of the through insulator vias 320A are similar to those described above for the through insulator vias 220A. Accordingly, for details or descriptions of the through insulator vias 320A not iterated herein, please refer to the aforesaid details or descriptions mentioned for the through insulator vias 220A.

After the through insulator vias 320A are formed, the semiconductor dies 310 are disposed on the redistribution structure 240. In some embodiments, the semiconductor dies 310 are placed onto the redistribution structure 240 through a pick-and-place method and are fixed to the redistribution structure 240 through a DAF 305. In some embodiments the semiconductor dies 310 are placed over the redistribution structure 240 with their top surfaces facing away from the redistribution structure 240 and their bottom surfaces attached to the redistribution structure 240 through the DAF 305. As shown in FIG. 2E, the DAF 305 is located only between the redistribution structure 240 and the semiconductor dies 310. In some embodiments, the semiconductor die 310 is a memory die, such as a DRAM, a RRA, a SRAM, a MRAM, or a FRAM. In some embodiments, the semiconductor dies 310 have substantially the same functions as the semiconductor dies 210. In some alternative embodiments, the semiconductor dies 310 may have different functions from the semiconductor dies 210.

In some embodiments, as shown in FIG. 1 and FIG. 2E, along the stacking direction Z, the sides of the semiconductor dies 310 extending along the direction X are vertically aligned with the sides of the semiconductor dies 210 extending along the direction X, and the sides of the semiconductor dies 310 extending along the direction Y are vertically aligned with the sides of the semiconductor dies 210 extending along the direction Y. That is to say, the semiconductor dies 310 and the semiconductor dies 210 are of about the same dimensions/sizes, and the semiconductor dies 310 are vertically aligned with the underlying semiconductor dies 210. With such configuration, within one packaging unit PU, two semiconductor dies 310 (shown in dotted lines in FIG. 1) are also provided side-by-side as a pair spaced apart from each other with the distance D2 along the direction Y, and the distance D2 is measured between two facing sides (i.e., the two long sides) of the semiconductor dies 310.

In some embodiments, as shown in FIG. 2E, an individual semiconductor die 310 includes a semiconductor substrate 311, at least one contact 313, and a protective layer 315. These elements of the semiconductor die 310 are similar to the semiconductor substrate 111, the contact 113 and the protective layer 115 of the semiconductor die 110, hence the detailed descriptions (e.g. the materials, formation processes, positioning configurations, etc.) of the said elements of the semiconductor die 310 are referred thereto.

As seen in FIG. 1 and FIG. 2E, within one packaging unit PU, the pair of semiconductor dies 310 are spaced apart from the through insulator vias 320A and are located beside the array of the through insulator vias 320A. In detail, the array of the through insulator vias 320A electrically connected with the underlying redistribution patterns 244A are located between the two facing sides (i.e., the two long sides) of the semiconductor dies 310 and are spaced apart from the semiconductor dies 310. With such configuration, the number of the through insulator vias 320A in tier 10C may be determined based on the spacing there-between, the distance D2 between the semiconductor chips 310, and the gap G1 between the semiconductor chips 110 in the tier 10A. As such, it should be noted that the number of the through insulator vias 320A described herein is merely for illustrative purposes, and may be varied at least depending on the design of redistribution patterns 244A in the redistribution conductive layer 244.

Continued on FIG. 2E, the encapsulant 330 is formed on the redistribution structure 240 laterally wrapping the semiconductor dies 310 and the through insulator vias 320A. Further, as shown in FIG. 2E, the encapsulant 330 is formed to fill the gap between the semiconductor dies 310, the gap between the through insulator vias 320A, and the gap between the semiconductor dies 310 and the through insulator vias 320A. In some embodiments, the encapsulant 330 may be referred to as "gap-fill material". The material and the manufacturing process of the encapsulant 330 are similar to those described above for the encapsulant 130. Therefore, for details or descriptions of the encapsulant 330 not iterated herein, please refer to the aforesaid details or descriptions mentioned for the encapsulant 130.

After the encapsulant 330 is formed, the redistribution structure 340 is formed on the encapsulant 330, the semiconductor dies 310, and the through insulator vias 320A. In some embodiments, as shown in FIG. 2E, the redistribution structure 340 includes a dielectric layer 342 and a redistribution conductive layer 344 embedded in the dielectric layer 342. In some embodiments, the redistribution conductive layer 344 includes multiple layers of redistribution patterns 344A that are electrically connected with the underlying semiconductor dies 310 and the underlying through insulator vias 320A. In detail, the semiconductor dies 310 are electrically connected with the semiconductor dies 210 through the redistribution patterns 344A of the redistribution conductive layer 344, the through insulator vias 320A, and the redistribution patterns 244A of the redistribution conductive layer 244. That is to say, the through insulator vias 320A establish electrical connections between the redistribution structures 240 and 340 and, consequently, between the semiconductor dies 210 and 310. In other words, along the stacking direction Z, the through insulator vias 320A, portions of the redistribution patterns 244A of the redistribution conductive layer 244, and portions of the redistribution patterns 344A of the redistribution conductive layer 344 provide a vertical signal path between the tier 10B and the tier 10C. With such configuration, the through insulator vias 320A as well as the through insulator vias 220A are located within the vertical signal transmission region U1 (shown in dotted lines in FIG. 1) of the packaging unit PU. Further, depending on the signal transmission requirements, it is understood that the arrangement of the through insulator vias 320A presented in FIG. 1 and FIG. 2E is merely for illustrative purposes, and other arrangement may be adapted to the through insulator vias 320A as long as the through insulator vias 320A are designed to be disposed within the vertical signal transmission region U1 and electrically connected with the underlying redistribution patterns 244A. The material and the manufacturing process of the dielectric layer 342 and the redistribution conductive layer 344 are similar to those described above for the dielectric layer 142 and the redistribution conductive layer 144. Therefore, for details or descriptions of the dielectric layer 342 and the redistribution conductive layer 344 not iterated herein, please refer to the aforesaid details or descriptions mentioned for the dielectric layer 142 and the redistribution conductive layer 144.

Following the formation of the tier 10C, a tier 10D may be sequentially formed on the tier 10B along the stacking direction Z. The configuration of the tier 10D plays significant roles in ensuring the heat dissipation of the subsequently formed memory device 20. The configuration and the manufacturing process of the tier 10D will be described in detail below in conjunction with FIG. 2E to FIG. 2F.

Continued on FIG. 2E, after forming the redistribution structure 340, through insulator vias 420A are formed on the redistribution structure 340. In some embodiments, the through insulator vias 420A are of substantially the same dimensions. In some embodiments, the through insulator vias 420A are formed on and connected with the redistribution patterns 344A of the redistribution conductive layer 344. In some embodiments, as shown in FIG. 1 and FIG. 2E, along the stacking direction Z, the through insulator vias 420A are vertically aligned with the through insulator vias 320A. However, the disclosure is not limited thereto. In some alternative embodiments, along the stacking direction Z, the through insulator vias 420A are staggered with the through insulator vias 320 A. In some embodiments, as shown in FIG. 1 and FIG. 2E, the through insulator vias 420A located right above one semiconductor die 110 are separate from one another and arranged as an array (i.e., a row) alongside the sidewall of the gap G1. It should be noted that even though one row of the through insulator vias 420A located right above one semiconductor die 110 is presented in FIG. 1 and FIG. 2E for illustrative purposes, more than one row of the through insulator vias 420A located right above one semiconductor die 110 may be provided over the redistribution structure 340. In some embodiments, along the stacking direction Z, the vertical projections of the through insulator vias 420A are not overlapped with the gap G1. The material and the manufacturing process of the through insulator vias 420A are similar to those described above for the through insulator vias 220A. Accordingly, for details or descriptions of the through insulator vias 420A not iterated herein, please refer to the aforesaid details or descriptions mentioned for the through insulator vias 220A.

After the through insulator vias 420A are formed, semiconductor dies 410 are disposed on the redistribution structure 340. In some embodiments, the semiconductor dies 410 are placed onto the redistribution structure 340 through a pick-and-place method and are fixed to the redistribution structure 340 through a DAF 405. In some embodiments the semiconductor dies 410 are placed over the redistribution structure 340 with their top surfaces facing away from the redistribution structure 340 and their bottom surfaces attached to the redistribution structure 340 through the DAF 405. As shown in FIG. 2E, the DAF 405 is located only between the redistribution structure 340 and the semiconductor dies 410. In some embodiments, the semiconductor die 410 is a memory die, such as a DRAM, a RRA, a SRAM, a MRAM, or a FRAM. In some embodiments, the semiconductor dies 410 have substantially the same functions as the semiconductor dies 310. In some alternative embodiments, the semiconductor dies 410 may have different functions from the semiconductor dies 310.

In some embodiments, as shown in FIG. 1 and FIG. 2E, along the stacking direction Z, the sides of the semiconductor dies 410 extending along the direction X are vertically aligned with the sides of the semiconductor dies 310 extending along the direction X, and the sides of the semiconductor dies 410 extending along the direction Y are vertically aligned with the sides of the semiconductor dies 310 extending along the direction Y. That is to say, the semiconductor dies 410 and the semiconductor dies 310 are of about the same dimensions/sizes, and the semiconductor dies 410 are vertically aligned with the underlying semiconductor dies 310. With such configuration, within one packaging unit PU, two semiconductor dies 410 (shown in dotted lines in FIG. 1) are also provided side-by-side as a pair spaced apart from each other with the distance D2 along the direction Y, and the distance D2 is measured between two facing sides (i.e., the two long sides) of the semiconductor dies 410.

In some embodiments, as shown in FIG. 2E, an individual semiconductor die 410 includes a semiconductor substrate 411, at least one contact 413, and a protective layer 415. These elements of the semiconductor die 410 are similar to the semiconductor substrate 111, the contact 113 and the protective layer 115 of the semiconductor die 110, hence the detailed descriptions (e.g. the materials, formation processes, positioning configurations, etc.) of the said elements of the semiconductor die 410 are referred thereto.

As seen in FIG. 1 and FIG. 2E, within one packaging unit PU, the pair of semiconductor dies 410 are spaced apart from the through insulator vias 420A and are located beside the array of the through insulator vias 420A. In detail, the array of the through insulator vias 420A electrically connected with the underlying redistribution patterns 344A are located between the two facing sides (i.e., the two long sides) of the semiconductor dies 410 and are spaced apart from the semiconductor dies 410. With such configuration, the number of the through insulator vias 420A may be determined based on the spacing there-between, the distance D2 between the semiconductor chips 410, and the gap G1 between the semiconductor chips 110 in the tier 10A. As such, it should be noted that the number of the through insulator vias 420A described herein is merely for illustrative purposes, and may be varied at least depending on the design of redistribution patterns 344A in the redistribution conductive layer 344.

Continued on FIG. 2E, an encapsulant 430 is formed on the redistribution structure 340 laterally wrapping the semiconductor dies 410 and the through insulator vias 420A. Further, as shown in FIG. 2E, the encapsulant 430 is formed to fill the gap between the semiconductor dies 410, the gap between the through insulator vias 420A, and the gap between the semiconductor dies 410 and the through insulator vias 420A. In some embodiments, the encapsulant 430 may be referred to as "gap-fill material". The material and the manufacturing process of the encapsulant 430 are similar to those described above for the encapsulant 130. Therefore, for details or descriptions of the encapsulant 430 not iterated herein, please refer to the aforesaid details or descriptions mentioned for the encapsulant 130.

Figure 2F:
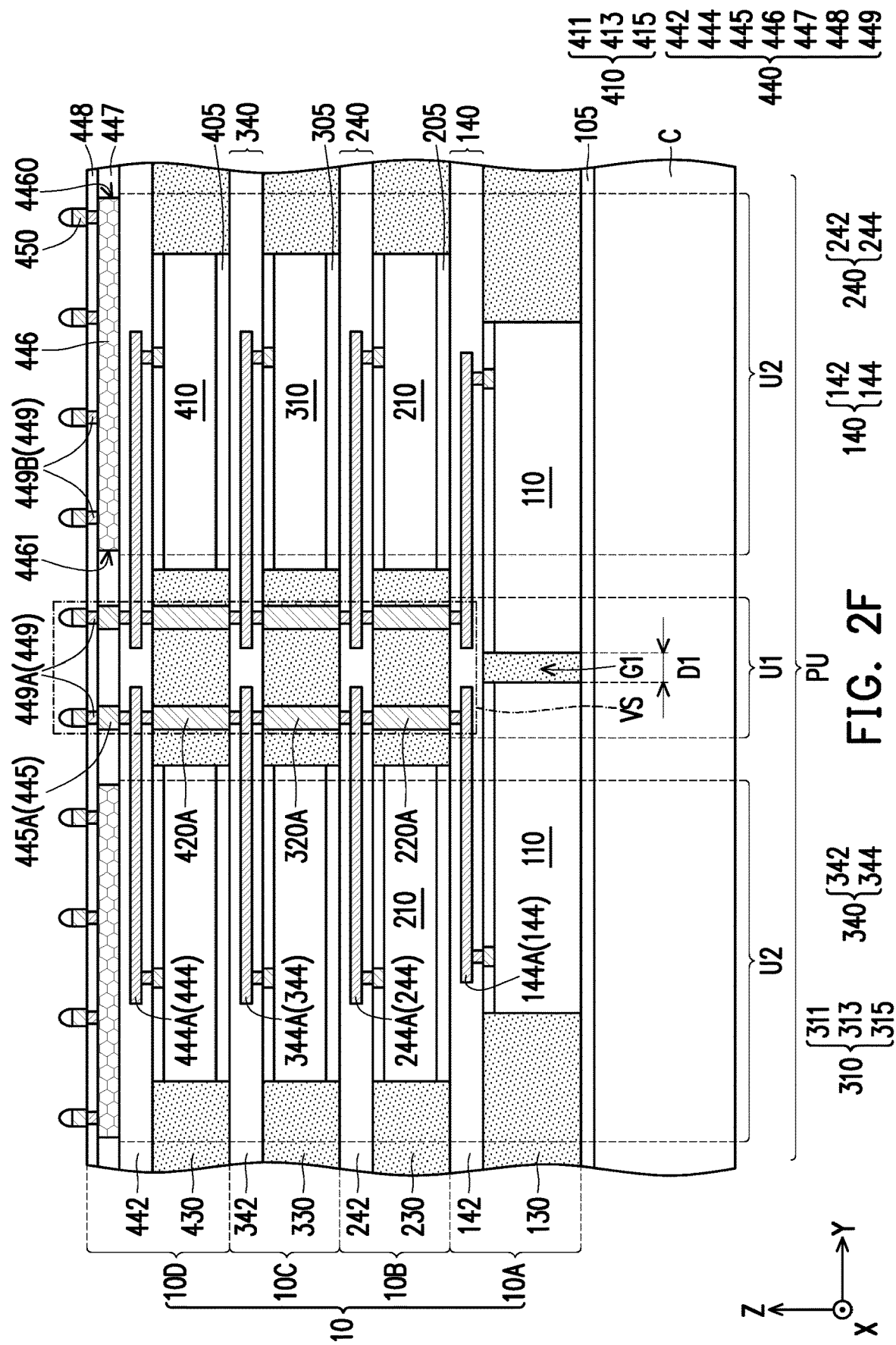

After the encapsulant 430 is formed, a redistribution structure 440 is formed on the encapsulant 430, the semiconductor dies 410, and the through insulator vias 420A. In some embodiments, as shown in FIG. 2E, the formation of the redistribution structure 440 includes firstly forming a dielectric layer 442 and a redistribution conductive layer 444 embedded in the dielectric layer 442. In some embodiments, the redistribution conductive layer 444 includes multiple layers of redistribution patterns 444A that are electrically connected with the underlying semiconductor dies 410 and the underlying through insulator vias 420A. In detail, the semiconductor dies 410 are electrically connected with the semiconductor dies 310 through the redistribution patterns 444A of the redistribution conductive layer 444, the through insulator vias 420A, and the redistribution patterns 344A of the redistribution conductive layer 344. That is to say, the through insulator vias 420A establish electrical connections between the redistribution structures 340 and 440 and, consequently, between the semiconductor dies 310 and 410. In other words, along the stacking direction Z, the through insulator vias 420A, portions of the redistribution patterns 344A of the redistribution conductive layer 344, and portions of the redistribution patterns 444A of the redistribution conductive layer 444 provide a vertical signal path between the tier 10C and the tier 10D (as shown in FIG. 2F). With such configuration, the through insulator vias 420A as well as the through insulator vias 220A are located within the vertical signal transmission region U1 (shown in dotted lines in FIG. 1) of the packaging unit PU. Further, depending on the signal transmission requirements, it is understood that the arrangement of the through insulator vias 420A presented in FIG. 1 and FIG. 2E is merely for illustrative purposes, and other arrangement may be adapted to the through insulator vias 420A as long as the through insulator vias 420A are designed to be disposed within the vertical signal transmission region U1 and electrically connected with the underlying redistribution patterns 344A. The material and the manufacturing process of the dielectric layer 442 and the redistribution conductive layer 444 are similar to those described above for the dielectric layer 142 and the redistribution conductive layer 144. Therefore, for details or descriptions of the dielectric layer 442 and the redistribution conductive layer 444 not iterated herein, please refer to the aforesaid details or descriptions mentioned for the dielectric layer 142 and the redistribution conductive layer 144.

Continued on FIG. 2E, after the dielectric layer 442 and the redistribution conductive layer 444 are formed, the formation of the redistribution structure 440 further includes forming a redistribution conductive layer 445 on the dielectric layer 442 and the redistribution conductive layer 444. In some embodiments, the redistribution conductive layer 445 includes a layer of redistribution patterns 445A that are electrically connected with the underlying redistribution patterns 444A. It should be noted that the number of the redistribution patterns 445A presented in FIG. 2E is merely for illustrative purposes, and may be varied at least depending on the design of redistribution patterns 444A in the redistribution conductive layer 444.

In one embodiment, the formation of the redistribution patterns 445A includes forming a mask pattern (not shown) with openings, then forming a conductive material (not shown) filling up the openings by electroplating or deposition, and removing the mask pattern to form the redistribution patterns 445A on the dielectric layer 442 and the redistribution conductive layer 444. In an alternative embodiment, the redistribution patterns 445A may be formed by forming a seed layer (not shown) on the dielectric layer 442 and the redistribution conductive layer 444; forming the mask pattern (not shown) with openings exposing portions of the seed layer; forming the conductive material (not shown) on the exposed portions of the seed layer to form the redistribution patterns 445A by plating; removing the mask pattern; and then removing portions of the seed layer exposed by the redistribution patterns 445A. In some embodiments, the material of the mask pattern may include a positive photo-resist or a negative photo-resist. In some embodiments, the conductive material of the redistribution patterns 445A includes a metal or metallic material, such as aluminum, titanium, copper, nickel, tungsten, silver, gold, combinations or alloys thereof. In certain embodiments, the conductive material of the redistribution patterns 445A includes copper or copper alloys. In some embodiments, the seed layer is a titanium/copper composited layer.

After the redistribution conductive layer 445 is formed, a thermally conductive layer 446 is formed over the dielectric layer 442 and the redistribution conductive layer 444. In some embodiments, as shown in FIG. 1 and FIG. 2E, within one packaging unit PU, the thermally conductive layer 446 has a frame shape that encircles the redistribution patterns 445A of the redistribution conductive layer 445. In detail, the thermally conductive layer 446 has an inner surface 446I and an outer surface 446O, and the inner surface 446I faces the redistribution patterns 445A encircled by the thermally conductive layer 446. Further, in some embodiments, the thermally conductive layer 446 extends laterally beyond the spans of the semiconductor dies 410. In detail, as shown in FIG. 1 and FIG. 2E, along the stacking direction Z, the vertical projections of the non-facing sides of the semiconductor dies 410 fall within the span of the vertical projection of the thermally conductive layer 446, and the vertical projection of the outer surface 446O of the thermally conductive layer 446 is located outside the span of the vertical projections of the semiconductor dies 410. From another point of view, in the cross-sectional view shown from FIG. 2E, from the inner surface 446I to the outer surface 446O, the thermally conductive layer 446 continuously extends from directly over the semiconductor dies 410 to laterally past the non-facing sides of the semiconductor dies 410. FIG. 2E illustrates that along the stacking direction Z, the inner surface 446I of the thermally conductive layer 446 is located within the spans of the semiconductor dies 410, but the disclosure is not limited thereto. In alternative embodiments, along the stacking direction Z, the inner surface 446I of the thermally conductive layer 446 may be vertically aligned with the facing sides of the semiconductor dies 410. In yet alternative embodiments, along the stacking direction Z, the inner surface 446I of the thermally conductive layer 446 may be located outside the spans of the semiconductor dies 410.

In some embodiments, the thermally conductive layer 446 is electrically isolated from the semiconductor dies 110, 210, 310 and 410. That is to say, the thermally conductive layer 446 is electrically floating. Since within the packaging unit PU, the thermally conductive layer 446 is laterally formed along a plane parallel to the direction X and the direction Y over the dielectric layer 442 and the redistribution conductive layer 444, the thermally conductive layer 446 provides laterally thermal paths, while provides no signal-transmitting function. Due to such configuration, a region where the thermally conductive layer 446 is located is referred to as a laterally thermal transmission region U2 (shown in dotted lines in FIG. 1) of the packaging unit PU. In some embodiments, as shown in FIG. 1 and FIG. 2E, within one packaging unit PU, the thermal transmission region U2 (shown in dotted lines in FIG. 1) has a frame shape that encircles and surrounds the vertical signal transmission region U1. In detail, as shown in FIG. 1 and FIG. 2E, the lateral thermal transmission region U2 is spaced apart from the vertical signal transmission region U1. With such configuration, along the stacking direction Z, the vertical projection of the thermally conductive layer 446 is spaced apart from the vertical projections of the through insulator vias 220A, 320A, and 420A.

In some embodiments, the formation of the thermally conductive layer 446 includes providing a mask M with multiple openings O; and performing a deposition process through the mask M to form the thermally conductive layer 446 corresponding to the openings O with a thermally conductive material. As mentioned above, in the cross-sectional views shown from FIG. 2A to FIG. 2I, one packaging unit PU is shown for simplicity, and thus although FIG. 2E illustrates that one opening O in the mask M, those skilled in the art can understand that multiple openings O corresponding to the multiple packaging units PU are formed in the mask M. In some embodiments, the deposition process is CVD, physical vapor deposition (PVD) or any other suitable film deposition process. In some embodiments, the opening O is provided to define a location of the thermally conductive layer 446, and thus the opening O is formed as a frame shape. In some embodiments, the thermally conductive material of the thermally conductive layer 446 has a maximum thermal conductivity along a plane substantially perpendicular to the stacking direction Z. That is to say, the thermally conductive material of the thermally conductive layer 446 exhibits an anisotropic characteristic with regard to thermal conductivity. From another point of view, in some embodiments, the thermally conducting material of the thermally conductive layer 446 has an in-plane thermal conductivity higher than a through-plane thermal conductivity. As used herein, the term "in-plane thermal conductivity" refers to the thermal conductivity along a plane substantially perpendicular to the stacking direction Z, i.e., along a plane substantially parallel to the direction X and the direction Y. And, the term "through-plane thermal conductivity" refers to the thermal conductivity through the plane, i.e., along a plane substantially parallel to the stacking direction Z. In certain embodiments, the in-plane thermal conductivity of the thermally conductive layer 446 is about 50 times to about 300 times of the through-plane thermal conductivity of the thermally conductive layer 446. As mentioned above, the conductive material of the redistribution patterns 445A includes a metal or metallic material which has an isotropic characteristic with regard to thermal conductivity, and thus the material of the thermally conductive layer 446 is different from the material of the redistribution conductive layer 445. Also, the material of the thermally conductive layer 446 is different from the materials of the redistribution conductive layers 144, 244, 344, 444. In certain embodiments, the thermally conducting material of the thermally conductive layer 446 includes graphene, a thermally conductive plastic material having an anisotropic characteristic with regard to thermal conductivity or a composite metal ceramic material having an anisotropic characteristic with regard to thermal conductivity.

In some embodiments, along the stacking direction Z, the thickness of the thermally conductive layer 446 ranges from about 10 μm to about 30 μm. In some embodiments, as shown in FIG. 2E, the thickness of the redistribution patterns 445A is greater than the thickness of the thermally conductive layer 446. However, the disclosure is not limited thereto. In some alternative embodiments, the thickness of the redistribution patterns 445A may be substantially equal to the thickness of the thermally conductive layer 446. Further, in some embodiments, the thickness of the thermally conductive layer 446 is greater than the thickness of the redistribution patterns 144A, the thickness of the redistribution patterns 244A, the thickness of the redistribution patterns 344A, and the thickness of the redistribution patterns 444A.

Referring to FIG. 2F, a dielectric layer 447 is formed over the dielectric layer 442 and the redistribution conductive layer 444 and surrounding the redistribution patterns 445A and the thermally conductive layer 446. In some embodiments, as seen in FIG. 2F, the dielectric layer 447 laterally encapsulates the redistribution patterns 445A and the thermally conductive layer 446. That is to say, the dielectric layer 447 covers and wrap around the sidewalls of the redistribution patterns 445A, and the inner surface 446I and the outer surface 446O of the thermally conductive layer 446. As mentioned above, the thermally conductive layer 446 is electrically isolated from the semiconductor dies 110, 210, 310 and 410, thereby the redistribution conductive layer 445 and the thermally conductive layer 446 embedded in the same dielectric layer 447 are electrically isolated from one another.

In some embodiments, the dielectric layer 447 is formed by forming an dielectric material (not shown) over the dielectric layer 442 and the redistribution conductive layer 444 fully covering the redistribution patterns 445A and the thermally conductive layer 446, and then performing a planarization process on the dielectric material to expose the illustrated top surfaces of the redistribution patterns 445A and the thermally conductive layer 446. In some embodiments, the dielectric material of the dielectric layer 447 includes PI, BCB, PBO, a nitride such as silicon nitride ($SiN_x$, where x>0), an oxide such as silicon oxide ($SiO_x$, where x>0), PSG, BSG, BPSG, a combination thereof or the like. In some embodiments, the dielectric material of the dielectric layer 447 is formed by suitable fabrication techniques such as spin-on coating, CVD, HDPCVD, PECVD, or the like. In some embodiments, the planarization process includes a mechanical grinding process, a CMP process, or combinations thereof. In the case that the thickness of the redistribution patterns 445A is greater than the thickness of the thermally conductive layer 446, during the planarization process, the redistribution patterns 445A are partially removed so that the illustrated top surfaces of the redistribution patterns 445A are substantially coplanar with and levelled with the illustrated top surface of the thermally conductive layer 446 and the illustrated top surface of the dielectric layer 447. In other words, the planarization process is performed until the illustrated top surfaces of the redistribution patterns 445A, the illustrated top surface of the thermally conductive layer 446 and the illustrated top surface of the dielectric layer 447 are substantially coplanar with one another.

Continued on FIG. 2F, after the dielectric layer 447 is formed, a dielectric layer 448 and a redistribution conductive layer 449 embedded in the dielectric layer 448 are formed on the dielectric layer 447, the redistribution patterns 445A and the thermally conductive layer 446. In some embodiments, the redistribution conductive layer 449 includes a layer of redistribution patterns 449A that are electrically connected with the underlying redistribution patterns 445A, and a layer of redistribution patterns 449B that are physically connected with the underlying thermally conductive layer 446. In some embodiments, the redistribution patterns 449A are conductive vias extending vertically through the dielectric layer 447 to establish electrical connection between the redistribution patterns 445A and the connectors 450 (described hereinafter), and the redistribution patterns 449B are dummy conductive vias extending vertically through the dielectric layer 447 to establish thermal connection between the thermally conductive layer 446 and the connectors 450 (described hereinafter). That is to say, the redistribution patterns 449A are electrically connected with the semiconductor dies 110, 210, 310 and 410, while the redistribution patterns 449B are electrically isolated from the semiconductor dies 110, 210, 310 and 410. In other words, the redistribution patterns 449B are not electrically connected with the redistribution patterns 449A in the same redistribution conductive layer 449. Although only one layer of the redistribution conductive layer 449 and one layer of the dielectric layer 447 are illustrated herein, the scope of the disclosure is not limited by the embodiments of the disclosure. In other embodiments, the numbers of the redistribution conductive layer 449 and the dielectric layer 447 may be adjusted based on product requirement. It should be noted that the number of the redistribution patterns 449A presented in FIG. 2F is merely for illustrative purposes, and may be varied at least depending on the design of redistribution patterns 445A in the redistribution conductive layer 445. Also, it should be noted that the number of the redistribution patterns 449B presented in FIG. 2F is merely for illustrative purposes, and may be adjusted based on product requirement.

When the dielectric layer 448 and the redistribution conductive layer 449 are formed, the redistribution structure 440 is accordingly formed. That is to say, the redistribution structure 440 includes the dielectric layer 442, the redistribution conductive layer 444, the redistribution conductive layer 445, the thermally conductive layer 446, the dielectric layer 447, the dielectric layer 448 and the redistribution conductive layer 449. And, when the redistribution structure 440 is formed, the tier 10D of the molded structure 10 is accordingly formed. That is to say, the semiconductor dies 410, the through insulator vias 420A, the encapsulant 430 and the redistribution structure 440 formed thereon together form the tier 10D.

Continued on FIG. 2F, after the tier 10D is formed, connectors 450 are formed on and connected with the redistribution structure 440 of the tier 10D. In some embodiments, under-bump metallurgies may be optionally formed below the connectors 450. The connectors 450 may include ball grid array (BGA) connectors, metal pillars, metal pillars with solder thereon, controlled collapse chip connection (C4) bumps, micro bump, a combination thereof, or the like. In some embodiments, the connectors 450 are micro bumps.

As shown in FIG. 2F, some of the connectors 450 are physically and electrically connected with the redistribution patterns 449A of the redistribution structure 440, and function as electrical terminals for the underlying semiconductor dies 110, 210, 310 and 410. As mentioned above, the semiconductor dies 110, 210, 310, 410 in the packaging unit PU are electrically connected via the through insulator vias 220A, 320A, 420A along with the redistribution structures 140, 240, 340, 440, thereby some connectors 450 that are connected to the redistribution patterns 449A are electrically connected to the semiconductor dies 110, 210, 310, 410 through the through insulator vias 420A, 320A, 220A as well as the redistribution structures 140, 240, 340, 440. In other words, within the vertical signal transmission region U1, a part of the redistribution structure 140, the through insulator vias 220A, a part of the redistribution structure 240, the through insulator vias 320A, a part of the redistribution structure 340, the through insulator vias 420A, a part of the redistribution structure 440 as well as some connectors 450 are configured to provide a vertical signal transmission structure VS from the tier 10A to the illustrated top surface of the tier 10D. Although the through insulator vias 220A, 320A, 420A located between the semiconductor dies 210, 310, 410 mainly function for electrical connection, it is understood that the semiconductor dies 110 and the through insulator vias 220A, 320A, 420A located within the spans of the semiconductor dies 110 together also assist heat dissipation for the regions situated between the semiconductor dies 210, 310, 410 under certain circumstances.

On the other hand, some of the connectors 450 that are connected with the redistribution patterns 449B of the redistribution structure 440 establish thermal connection, rather than for electrical connection. That is to say, some of the connectors 450 that are connected with the redistribution patterns 449B are referred to as dummy connectors. As mentioned above, the redistribution patterns 449B and the thermally conductive layer 446 to which the redistribution patterns 449B are physically connected are electrically isolated from the semiconductor dies 110, 210, 310 and 410, such that within the laterally thermal transmission region U2, the thermally conductive layer 446, the redistribution patterns 449B as well as some connectors 450 that are physically connected to the redistribution patterns 449B are configured to provide thermal paths for assisting heat dissipation without transmitting signal.

Figure 2G:
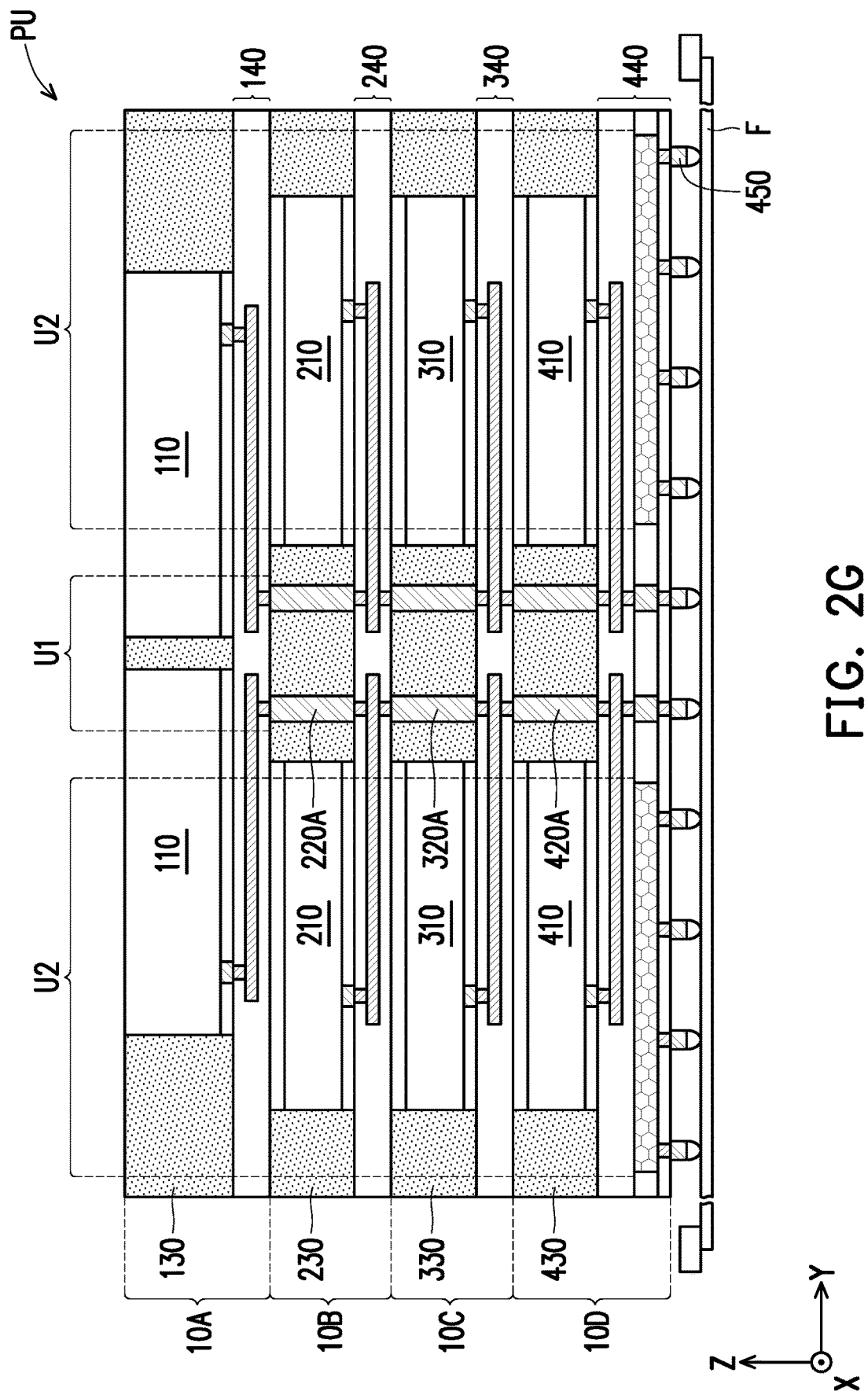

Referring to FIG. 2G, after forming the connectors 450, the structure shown in FIG. 2F is turned upside down and placed on a frame structure F for further processing. Further, as illustrated in FIG. 2G, the carrier C is de-bonded and is separated from the encapsulant 130 and the semiconductor dies 110. During the de-bonding process, a portion of the DAF 105 may stick on the carrier C and may be carried away by the carrier C. Meanwhile, another portion of the DAF 105 remains on the encapsulant 130 and the semiconductor dies 110. In some embodiments, the remaining portion of the DAF 105 is removed by wet etching or laser cleaning. In some embodiments, after removing the carrier C and the DAF 105 from the encapsulant 130 and the semiconductor dies 110, as illustrated in FIG. 2G, the exposed surfaces (i.e., the illustrated top surfaces) of the semiconductor dies 110 are substantially coplanar with and levelled with the exposed surface (i.e., the illustrated top surface) of the encapsulant 130.

Subsequently, continued on FIG. 2G, after removing the carrier C and the DAF 105, by cutting through the encapsulants 130, 230, 330, 430 and the redistribution structures 140, 240, 340, 440, the molded structure 10 may be singulated or diced into individual packaging units PU. In some embodiments, the packaging unit PU includes multiple tiers 10A-10D of stacked semiconductor dies 110, 210, 310, 410 encapsulated by respective encapsulants 130, 230, 330, 430, and redistribution structures 140, 240, 340, 440 for electrically connecting the semiconductor dies 110, 210, 310, 410. In some embodiments, when one or more of the stacked semiconductor dies 110, 210, 310, 410 are or include memory dies, the packaging unit PU is referred to as a memory cube.

Figure 2H:
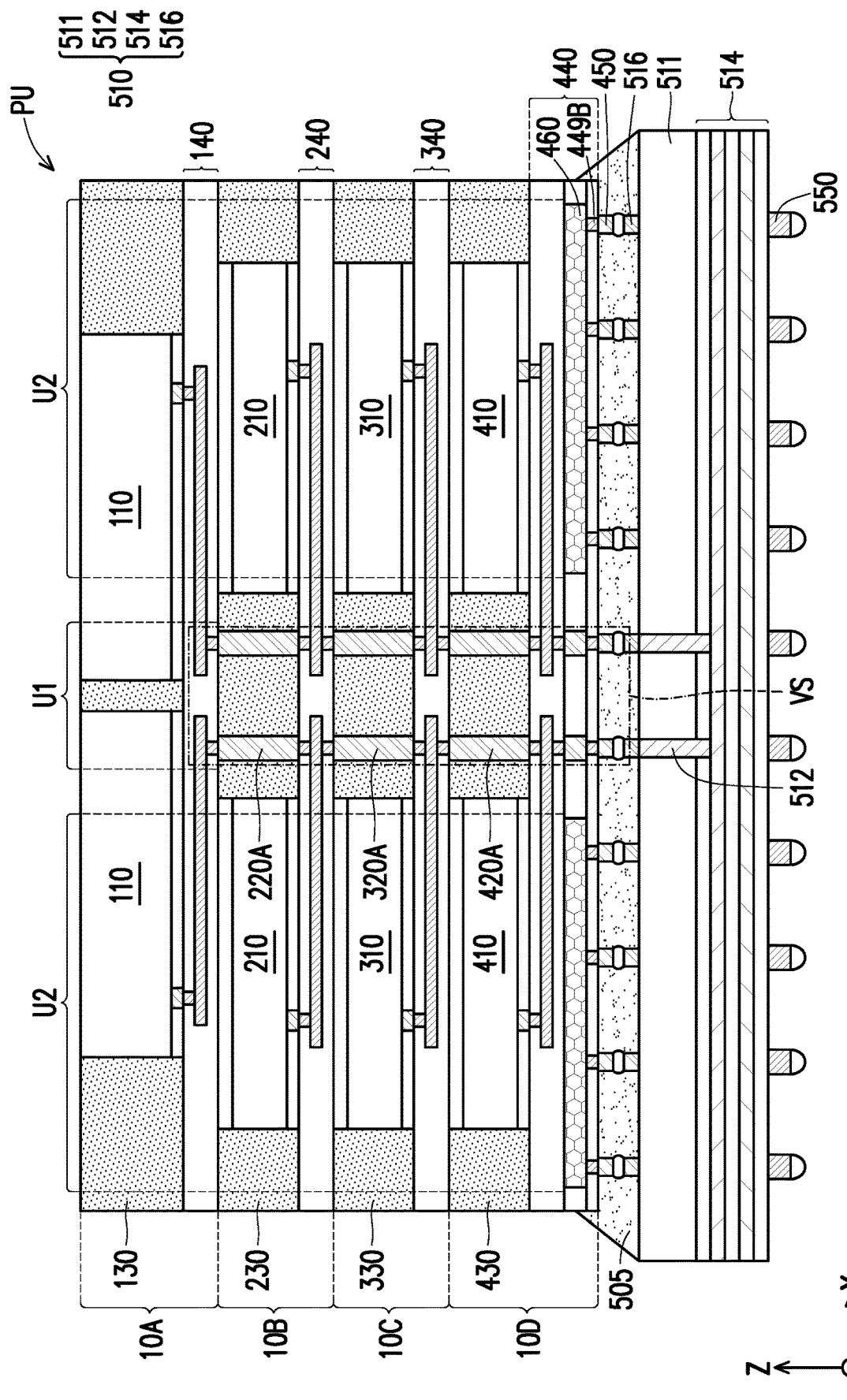

Referring to FIG. 2H, the packaging unit PU is then placed on a semiconductor die 510. In some embodiments, as shown in FIG. 2H, the packaging unit PU is connected to the semiconductor die 510 through the connectors 450 bonded to the contact pads 516 of the semiconductor die 510. In some embodiments, an underfill 505 is further provided to fill the gap between the packaging unit PU and the semiconductor die 510 to physically protect the connection between the connectors 450 and the contact pads 516. Owing to the underfill 505, a bonding strength between the packaging unit PU and the semiconductor die 510 are enhanced, thereby improving the reliability of the subsequently formed memory device 20. In some embodiments, the semiconductor die 510 is or includes a logic die, such as a controller die or die with processing circuits. Although FIG. 2H illustrates that one packaging unit PU is mounted and bonded to the semiconductor die 510, it should be noted that the number of the packaging unit PU bonded to the semiconductor die 510 is not limited thereto, and this can be adjusted based on demand and/or design layout.

In some embodiments, the semiconductor die 510 further includes a semiconductor substrate 511, through substrate vias 512, and interconnection layers 514. The semiconductor die 510 has a larger footprint than the packaging unit PU (e.g., memory cube). Conductive terminals 550 are provided on the illustrated bottom surface of the semiconductor die 510 for further electrical connection. In some embodiments, under-bump metallurgies may be optionally formed below the conductive terminals 550. The conductive terminals 550 may include ball grid array (BGA) connectors, metal pillars, metal pillars with solder thereon, controlled collapse chip connection (C4) bumps, micro bump, a combination thereof, or the like. In some embodiments, the conductive terminals 550 are C4 bumps.

In some embodiments, as shown in FIG. 2H, the semiconductor dies 110, 210, 310, 410 in the packaging unit PU are electrically connected with the semiconductor die 510 through the connectors 450 within the vertical signal transmission region U1 and some of the contact pads 516 connected with such connectors 450, and are further electrically connected with the conductive terminals 550 through the through substrate vias 512 and the interconnection layers 514. That is to say, the through substrate vias 512 are arranged in a region of the semiconductor die 510 corresponding to the vertical signal transmission region U1, where the through insulator vias 220A, 320A, 420A are located, of the packaging unit PU. Further, the vertical signal transmission structure VS (provided by a part of the redistribution structure 140, the through insulator vias 220A, a part of the redistribution structure 240, the through insulator vias 320A, a part of the redistribution structure 340, the through insulator vias 420A, a part of the redistribution structure 440 as well as some connectors 450 that are electrically connected to the redistribution structure 440) within the vertical signal transmission region U1 of the packaging unit PU is configured to transmit signals between the semiconductor die 510 and the semiconductor dies 110, 210, 310, 410.

On the other hand, some of the contact pads 516 that are connected with the connectors 450 within the laterally thermal transmission region U2 establish thermal connection for assisting heat dissipation, rather than for electrical connection. That is to say, some of the contact pads 516 that are connected with the connectors 450 within the laterally thermal transmission region U2 are electrically isolated from the semiconductor dies 110, 210, 310 and 410 of the packaging unit PU, and the thermally conductive layer 446, the redistribution patterns 449B as well as some connectors 450 that are physically connected to the redistribution patterns 449B (which provide the thermal paths) within the laterally thermal transmission region U2 of the packaging unit PU are electrically isolated from the semiconductor die 510. In other words, some of the contact pads 516 that are connected with the connectors 450 within the laterally thermal transmission region U2 are referred to as dummy contact pads.

Figure 2I:
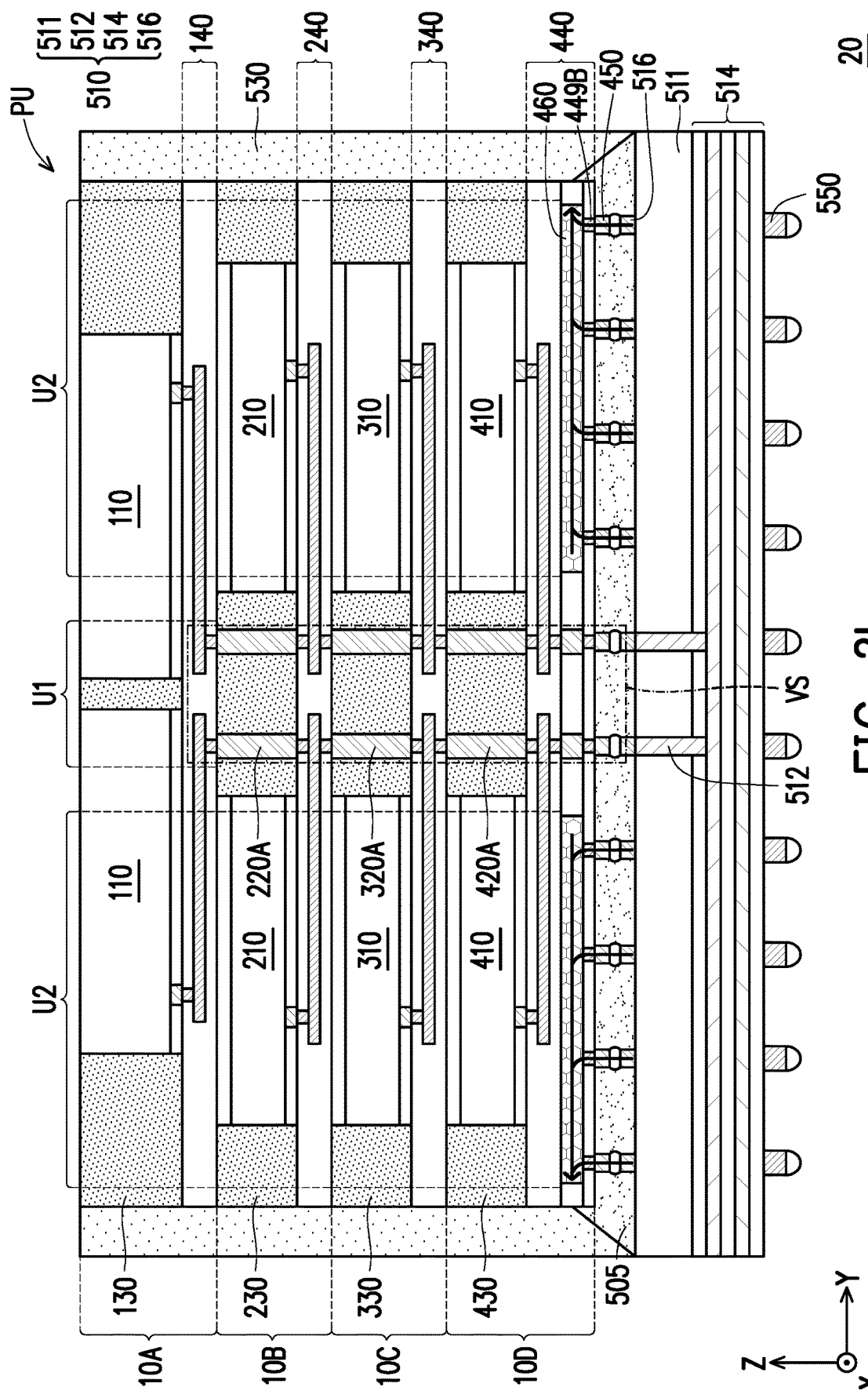

Referring to FIG. 2I, the memory device 20 is completed by further forming a molding compound 530 to laterally wrap the packaging unit PU bonded to the semiconductor die 510. In some embodiments, the material of the molding compound 530 includes epoxy resins, phenolic resins or other curable resin materials, and may further include fillers. In some embodiments, the molding compound 530 is formed through an over-molding process. For example, the over-molding process is a compression molding process. In some alternative embodiments, the molding compound 530 is formed through a film deposition process. For example, the film deposition process includes CVD, HDPCVD, PECVD, ALD, or combinations thereof. In one embodiment, the material of the molding compound 530 is different from the materials of the encapsulants 130, 230, 330, 430. In one embodiment, the material of the molding compound 530 is substantially the same as the materials of the encapsulants 130, 230, 330, 430. In some embodiments, the memory device 20 may be connected to a circuit substrate, a printer circuit board or even integrated with other devices via the conductive terminals 550. Also, a heat sink or cooling module (not shown) may be optionally mounted onto the illustrated top surface of memory device 20 during applications.

As mentioned above, since the thermally conductive layer 446, the redistribution patterns 449B as well as some connectors 450 that are physically connected to the redistribution patterns 449B (which provide the thermal paths) within the laterally thermal transmission region U2 of the packaging unit PU are thermally connected with the semiconductor die 510, when the memory device 20 is in operation, heat generated in the semiconductor die 510 during operation may be more easily conveyed or dissipated through such thermal paths to the outer or external environment, which significantly improves the heat dissipation of the memory device 20. Further, by disposing the thermally conductive layer 446 which provides laterally thermal paths (represented by the arrows shown in FIG. 2I) along the plane parallel to the direction X and the direction Y within the tier 10D (i.e., the bottommost tier) closest to the semiconductor die 510 to conveyed or dissipated heat generated in the semiconductor die 510 during operation, not only the heat dissipation of the memory device 20 is significantly improved to reduce the operation temperature of the memory device 20, but the hot spots induced in the semiconductor die 510 are also eliminated. Moreover, due to the anisotropic characteristic with regard to thermal conductivity of the thermally conductive layer 446, the formation of the thermal paths within the laterally thermal transmission region U2 of the packaging unit PU helps to guide the heat generated from the semiconductor die 510 conveyed or dissipated through the said thermal paths more easily along the plane substantially parallel to the direction X and the direction Y than the plane substantially parallel to the stacking direction Z, which significantly protects the semiconductor dies 110, 210, 310 and 410 of the packaging unit PU from damage caused by the heat generated from the semiconductor die 510 and improves the heat dissipation of the memory device 20. Through the formation of the thermal paths within the laterally thermal transmission region U2 of the packaging unit PU, the heat dissipation efficiency of the memory device 20 is at least improved by about 50%. As a result, the reliability of the memory device 20 is enhanced and the performance of the memory device 20 is boosted.

In some embodiments, the memory device 20 includes the packaging unit PU (e.g., the memory cube) including multiple tiers 10A-10D of stacked semiconductor dies 110, 210, 310, 410 encapsulated by respective encapsulants 130, 230, 330, 430, and redistribution structures 140, 240, 340, 440 for electrically connecting the semiconductor dies 110, 210, 310, 410, and the semiconductor die 510 bonded to the packaging unit PU through the connectors 450. With such configuration, the tier 10D closest to the semiconductor die 510 is referred to as a bottommost tier, the tier 10A farthest away from the semiconductor die 510 is referred to as a topmost tier, and each of the tier 10B and the tier 10C located between the tier 10A and the tier 10D is referred to as a middle tier. Although FIG. 2I illustrates that the packaging unit PU includes four tiers (i.e., the tiers 10A-10D) containing two middle tiers (i.e., the tier 10B and the tier 10C), it should be noted that the number of the middle tiers located between the topmost tier and the bottommost tier is not limited thereto, and this can be adjusted based on demand and/or design layout. For example, the packaging unit PU includes eight tiers which contain six middle tiers. In view of the above, in some embodiments, by disposing the thermally conductive layer 466 electrically isolated from the semiconductor dies 110, 210, 310 and 410 in the tier 10A (i.e., the bottommost tier), the heat dissipation efficiency of the memory device 20 is greatly increased.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the memory device 20 illustrated in FIG. 1 and FIG. 2I, the thermally conductive layer 446 formed within the thermal transmission region U2 has a frame shape with a continuous pattern. However, the disclosure is not limited thereto. In some alternative embodiments, the thermally conductive layer 446 within the thermal transmission region U2 may has a mesh pattern, as shown in FIG. 3.

Figure 3:
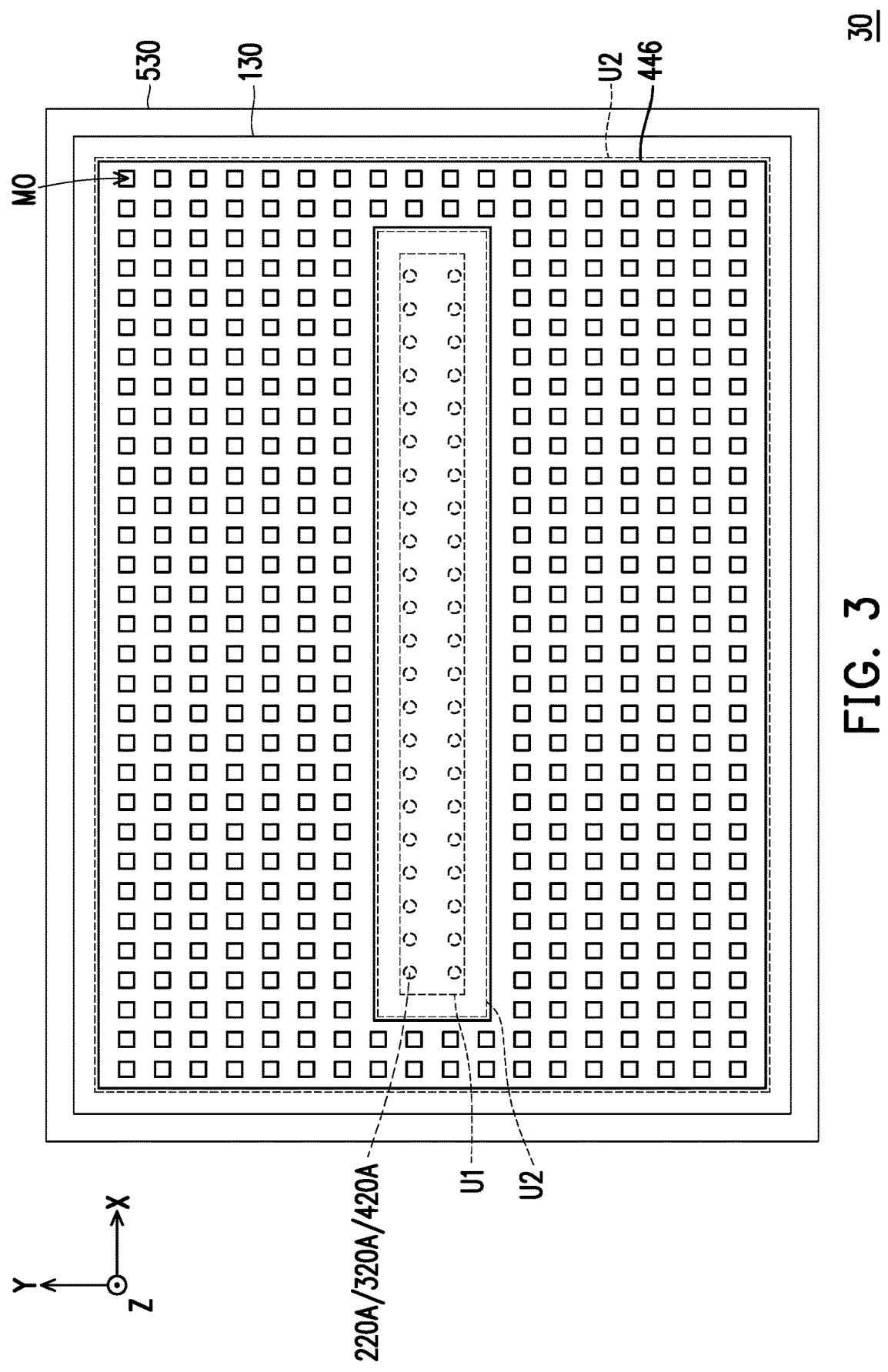
FIG. 3 is a schematic top view of a memory device according to some alternative embodiments of the present disclosure.

FIG. 3 is a schematic top view of a memory device 30 according to some alternative embodiments of the present disclosure. Referring to FIG. 3 and FIG. 1, the memory device 30 illustrated in FIG. 3 is similar to the memory device 20 illustrated in FIG. 1, hence the same reference numerals are used to refer to the same or liked parts, and its detailed description will be omitted herein. The differences between the memory device 30 illustrated in FIG. 3 and the memory device 20 illustrated in FIG. 1 will be described below. The top view of FIG. 3 mainly shows another configuration of the thermally conductive layer 446, and thus for simplicity and clarity of illustration, some elements of the memory device 30 are omitted in the simplified top view of FIG. 3.

Referring to FIG. 3, the thermally conductive layer 446 of the memory device 30 within the thermal transmission region U2 has a frame shape with a mesh pattern, where the mesh pattern includes multiple openings MO. With such configuration, during the formation of the thermally conductive layer 446, a mask utilized for forming the thermally conductive layer 446 may have multiple openings each has an outline corresponding to the outline of the thermally conductive layer 446.

In the memory device 20 illustrated in FIG. 1 and FIG. 2I, the memory device 20 includes the thermal paths provided by the thermally conductive layer 446, the redistribution patterns 449B as well as some connectors 450 that are physically connected to the redistribution patterns 449B within the laterally thermal transmission region U2 of the packaging unit PU. However, the disclosure is not limited thereto. In some alternative embodiments, other thermal transmission structure, such as thermal through substrate vias or the like, can be further disposed in the memory device as needed. Hereinafter, other embodiments will be described in conjunction with FIG. 5 to FIG. 7.

Figure 4:
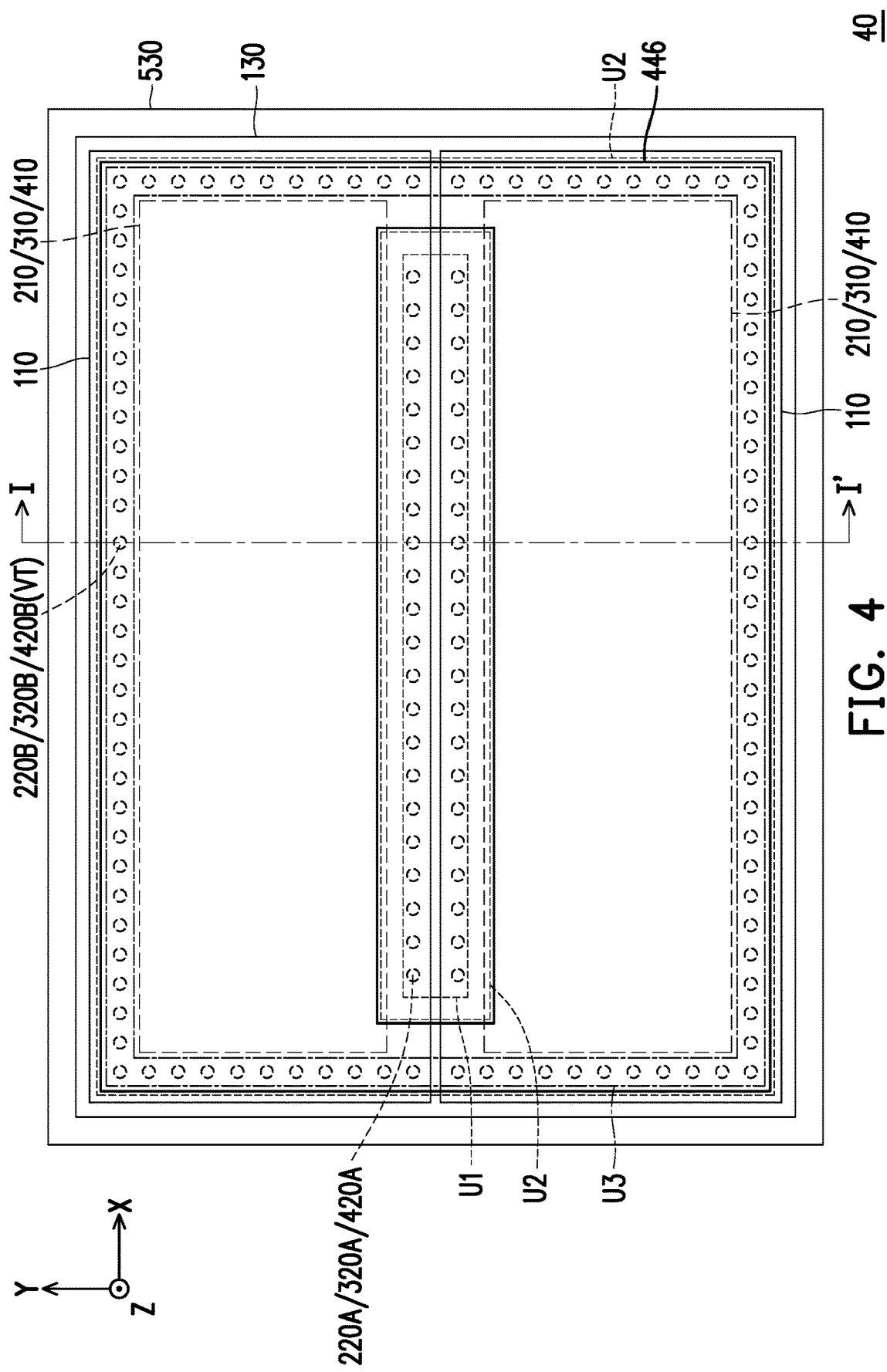
FIG. 4 is a schematic top view of a memory device according to some alternative embodiments of the present disclosure.
Figure 5:
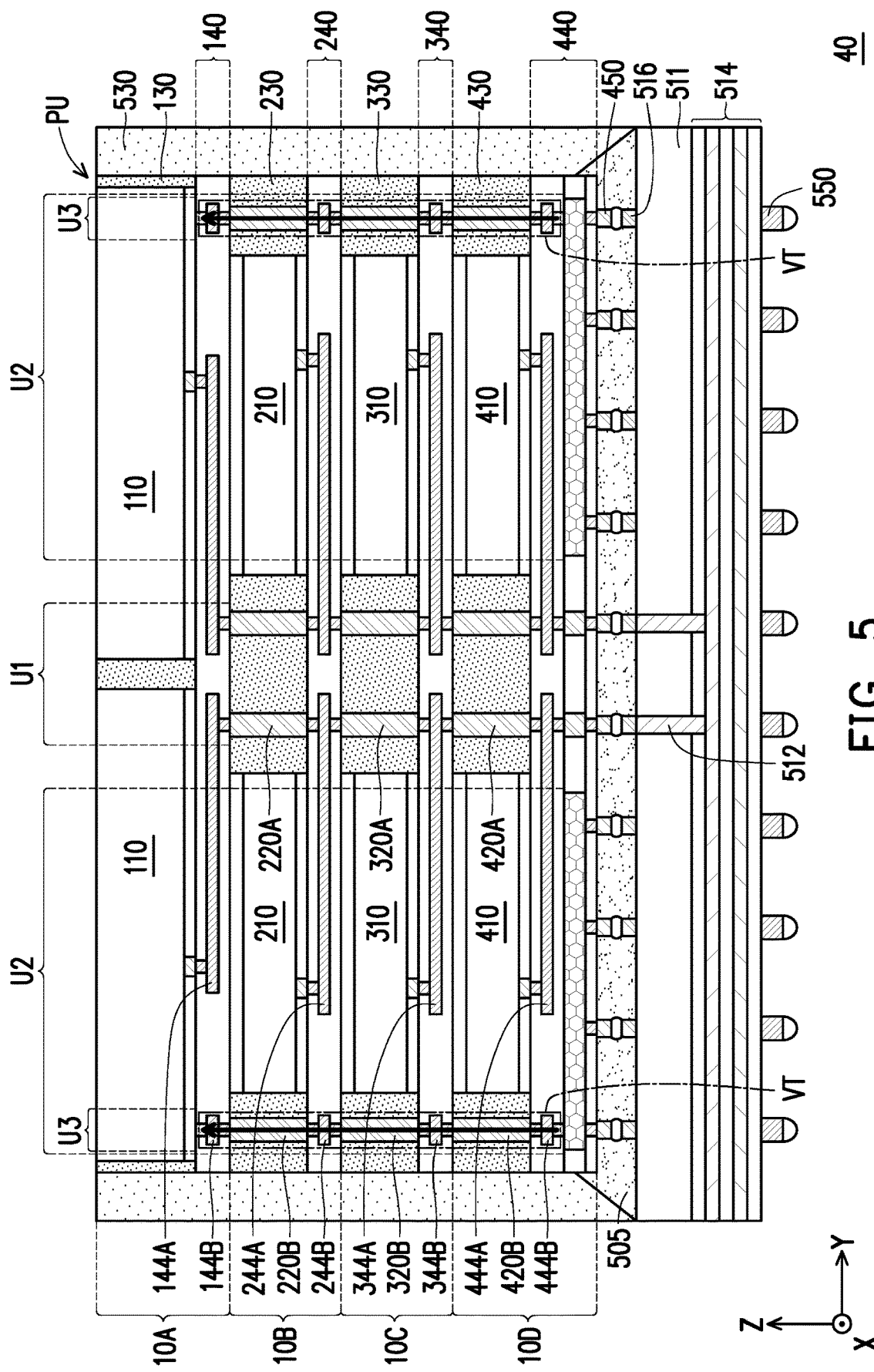
FIG. 5 is a schematic cross-sectional view of a memory device according to some alternative embodiments of the present disclosure.

FIG. 4 is a schematic top view of a memory device according to some alternative embodiments of the present disclosure. FIG. 5 is a schematic cross-sectional view of a memory device according to some alternative embodiments of the present disclosure. FIG. 5 is a schematic cross-sectional view taken along the cross-section line I-I' of FIG. 4. Referring to FIG. 5 and FIG. 2I, the memory device 40 illustrated in FIG. 5 is similar to the memory device 20 illustrated in FIG. 2I, hence the same reference numerals are used to refer to the same or liked parts, and its detailed description will be omitted herein. The differences between the memory device 40 illustrated in FIG. 5 and the memory device 20 illustrated in FIG. 2I will be described below. The top view of FIG. 4 mainly shows the relative positional relationships for the through insulator vias 220A, 320A, 420A, the thermally conductive vias 220B, 320B, 420B, the semiconductor dies 110, 210, 310, 410 and the thermally conductive layer 446 in the singulated packaging unit PU. Therefore, for simplicity and clarity of illustration, some elements of the memory device 40 are omitted in the simplified top view of FIG. 4.

Referring to FIG. 4 and FIG. 5, in the memory device 40, the packaging unit PU has a vertical thermal transmission region U3 overlapped with the lateral thermal transmission region U2 and located at outer edges of the lateral thermal transmission region U2. In some embodiments, as shown in FIG. 4, the vertical thermal transmission region U3 has a frame shape. In some embodiments, as shown in FIG. 4, along the stacking direction Z, the vertical projection of the vertical thermal transmission region U3 encircles and surrounds the vertical projections of the semiconductor dies 210, 310 and 410.

In some embodiments, as shown in FIG. 4 and FIG. 5, in the memory device 40, the packaging unit PU has a vertical thermal transmission structure VT vertically extending through the multiple tiers 10A-10D along the stacking direction Z within the vertical thermal transmission region U3. In some embodiments, as shown in FIG. 4 and FIG. 5, the vertical thermal transmission structure VT includes multiple layers of redistribution patterns 144B in the redistribution conductive layer 144, thermally conductive vias 220B laterally wrapped by the encapsulant 230, multiple layers of redistribution patterns 244B in the redistribution conductive layer 244, thermally conductive vias 320B laterally wrapped by the encapsulant 330, multiple layers of redistribution patterns 344B in the redistribution conductive layer 344, and thermally conductive vias 420B laterally wrapped by the encapsulant 430. In some embodiments, as shown in FIG. 4 and FIG. 5, the thermally conductive vias 220B are directly connected with the redistribution patterns 144B of the redistribution conductive layer 144, the redistribution patterns 244B of the redistribution conductive layer 244 are directly connected with the thermally conductive vias 220B and the thermally conductive vias 320B, the redistribution patterns 344B of the redistribution conductive layer 344 are directly connected with the thermally conductive vias 320B and the thermally conductive vias 420B. That is to say, the vertical thermal transmission structure VT includes multiple vertically connected structures constructed by the redistribution patterns 144B, the thermally conductive vias 220B, the redistribution patterns 244B, the thermally conductive vias 320B, the redistribution patterns 344B, and the thermally conductive vias 420B.

In some embodiments, the through insulator vias 220A and the thermally conductive vias 220B are formed from substantially the same material through the same manufacturing process. In other words, the thermally conductive vias 220B are fabricated along with the through insulator vias 220A through the manufacturing process of the through insulator vias 220A. Similarly, the thermally conductive vias 320B are fabricated along with the through insulator vias 320A through the manufacturing process of the through insulator vias 320A, and the thermally conductive vias 420B are fabricated along with the through insulator vias 420A through the manufacturing process of the through insulator vias 420A.

In some embodiments, as shown in FIG. 4 and FIG. 5, the thermally conductive vias 220B have the same dimensions as the through insulator vias 220A, the thermally conductive vias 320B have the same dimensions as the through insulator vias 320A, the thermally conductive vias 420B have the same dimensions as the through insulator vias 420A. It should be noted that the numbers of the thermally conductive vias 220B, 320B, 440B described herein are merely for illustrative purposes, and may be determined based on the area of the vertical thermal transmission region U3. Further, it should be noted that the arrangements of the thermally conductive vias 220B, 320B, 440B presented in FIG. 4 and FIG. 5 are merely for illustrative purposes, and other arrangements may be adapted to the thermally conductive vias 220B, 320B, 420B as long as the thermally conductive vias 220B, 320B, 420B are designed to be disposed within the vertical thermal transmission region U3. In some embodiments, as shown in FIG. 4 and FIG. 5, along the stacking direction Z, the thermally conductive vias 220B are vertically aligned with the thermally conductive vias 320B, and the thermally conductive vias 320B are vertically aligned with the thermally conductive vias 440B. However, the disclosure is not limited thereto. For example, in some embodiments, along the stacking direction Z, the thermally conductive vias 220B are staggered with the thermally conductive vias 320B, and the thermally conductive vias 320B are staggered with the thermally conductive vias 440B. Referring to the top view shown in FIG. 4, in some embodiments, the thermally conductive vias 220B, 320B, 440B within the vertical thermal transmission region U3 are arranged in one row alongside the non-facing sides of the semiconductor dies 210, 310, 410. However, it is understood that the thermally conductive vias 220B, 320B, 440B may be arranged as multiple rows, columns, lines or even as arrays at one side, two sides, or three sides of the semiconductor dies 210, 310, 410, depending on the thermal dissipation requirements.

As illustrated in FIG. 4, the top view of each of the thermally conductive vias 220B, 320B, 440B exhibits a circular shape. In other words, a cross-section of each of the thermally conductive vias 220B, 320B, 440B parallel to the illustrated top surface 110t (as shown in FIG. 2B) of the semiconductor die 110 is a circle. However, the disclosure is not limited thereto. In some alternative embodiments, the top view of each of the thermally conductive vias 220B, 320B, 440B may exhibit a rectangular shape, an elliptical shape, a polygonal shape or other suitable shapes. When the top view of each of the thermally conductive vias 220B, 320B, 440B exhibit a rectangular shape, the thermally conductive vias 220B, 320B, 440B may be referred to as thermally conductive walls.

In some embodiments, the vertical thermal transmission structure VT is electrically isolated from the semiconductor dies 110, 210, 310, 410. That is to say, the redistribution patterns 144B are electrically isolated from the redistribution patterns 144A in the same redistribution conductive layer 144, the redistribution patterns 244B are electrically isolated from the redistribution patterns 244A in the same redistribution conductive layer 244, the redistribution patterns 344B are electrically isolated from the redistribution patterns 344A in the same redistribution conductive layer 344, and the redistribution patterns 444B are electrically isolated from the redistribution patterns 444A in the same redistribution conductive layer 444. In some embodiments, the thermal conductivity of the thermally conductive vias 220B is larger than the thermal conductivity of the encapsulant 230, the thermal conductivity of the thermally conductive vias 320B is larger than the thermal conductivity of the encapsulant 330, the thermal conductivity of the thermally conductive vias 420B is larger than the thermal conductivity of the encapsulant 430. That is to say, the vertical thermal transmission structure VT has a thermal conductivity larger than that of the encapsulants 230, 330, 430.

In some embodiments, the vertical thermal transmission structure VT is connected with the semiconductor dies 110 in the tier 10A. In detail, as shown in FIG. 4 and FIG. 5, within the packaging unit PU of the memory device 40, portions of the semiconductor dies 110 in the tier 10A are located within the vertical thermal transmission region U3, and the redistribution patterns 144B are physically connected with the portions of the semiconductor dies 110. From another point of view, in the memory device 40, the size of each semiconductor die 110 is larger than the size of each semiconductor die 210, the size of each semiconductor die 310, and the size of each semiconductor die 410. As shown in FIG. 4 and FIG. 5, along the stacking direction Z, the vertical projection of the underlying semiconductor die 210, the vertical projection of the underlying semiconductor die 310 and the vertical projection of the underlying semiconductor die 410 all fall within the span of the vertical projection of the corresponding semiconductor die 110. In some embodiments, the semiconductor die 110 of the memory device 40 is pre-fabricated integrally with the extended portions. However, the disclosure is not limited thereto. In some alternative embodiments, the semiconductor die 110 of the memory device 40 is provided by disposing dummy dies right next to the non-facing sides of the semiconductor die 110 of the memory device 20.

In some embodiments, the vertical thermal transmission structure VT is connected with the thermally conductive layer 446 in the tier 10D. In detail, as shown in FIG. 5, within the packaging unit PU of the memory device 40, the redistribution patterns 444B are physically connected with the thermally conductive layer 446. As mentioned above, the thermally conductive layer 446 is configured to provide thermal paths for assisting heat dissipation, and thus the vertical thermal transmission structure VT physically connected with the thermally conductive layer 446 and the portions of the semiconductor dies 110 physically connected with the vertical thermal transmission structure VT also function as parts of the thermal paths. That is to say, in the memory device 40, the vertically connected structures including the redistribution patterns 144B, the thermally conductive vias 220B, the redistribution patterns 244B, the thermally conductive vias 320B, the redistribution patterns 344B, the thermally conductive vias 420B, the redistribution patterns 444B, and the portions of the semiconductor dies 110 thermally connected with the redistribution patterns 144B form vertical thermal paths (represented by the arrows shown in FIG. 5) for assisting heat dissipation. In other words, by disposing the vertical thermal transmission structure VT vertically extending through the multiple tiers 10A-10D along the stacking direction Z within in the vertical thermal transmission region U3 and thermally connecting between the thermally conductive layer 446 and the semiconductor dies 110, in addition to the laterally thermal paths provided by the thermally conductive layer 446 (as shown in FIG. 2I), the memory device 40 further includes the vertical thermal paths (represented by the arrows shown in FIG. 5) located at the peripheral region or edges of the packaging unit PU. And, the formation of vertical thermal paths (represented by the arrows shown in FIG. 5) further helps to guide the heat generated from the semiconductor die 510 to the upper tiers, or even to the heat sink or cooling module, which further improves the heat dissipation of the memory device 40.

Figure 6:
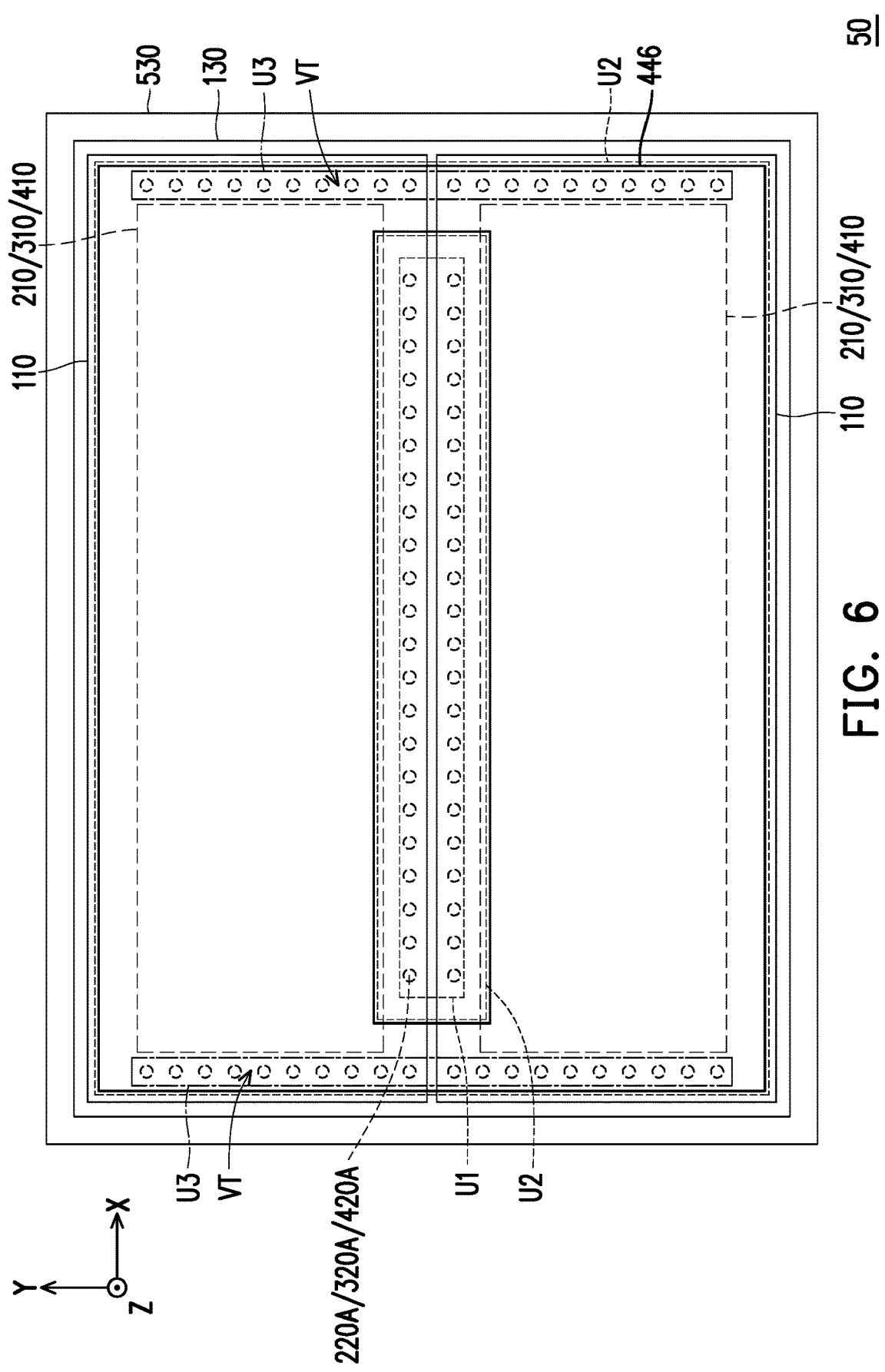
FIG. 6 is a schematic top view of a memory device according to some alternative embodiments of the present disclosure.
Figure 7:
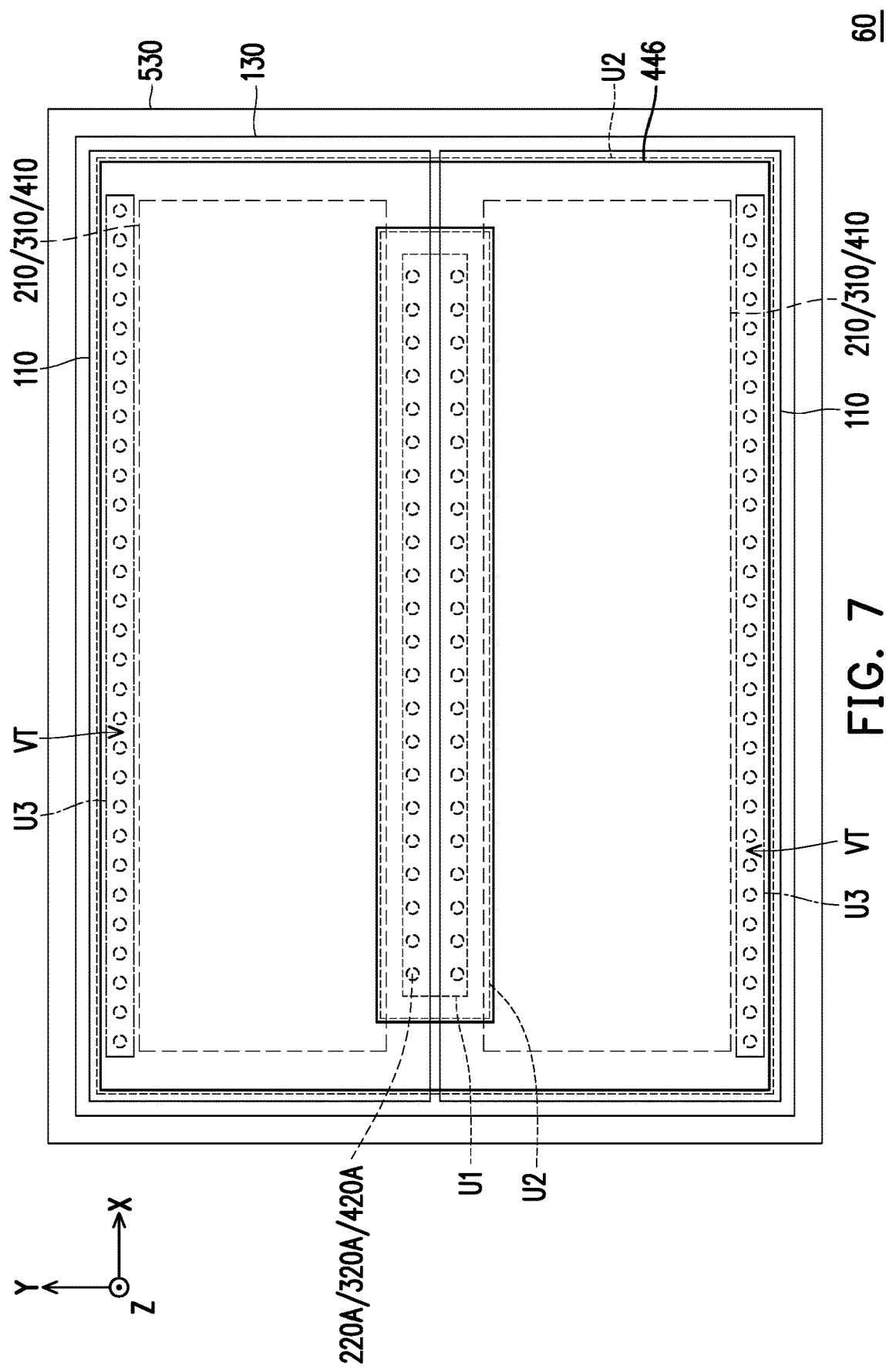
FIG. 7 is a schematic top view of a memory device according to some alternative embodiments of the present disclosure.

In the memory device 40 illustrated in FIG. 4 and FIG. 5, the vertical thermal transmission structure VT located within the vertical thermal transmission region U3 is disposed beside and around the non-facing sides of the semiconductor dies 210, 310, 410. However, it is understood that the vertical thermal transmission structure VT may be arranged at one side, two sides, or three sides of the semiconductor dies 210, 310, 410, depending on the thermal dissipation requirements. In alternative embodiments, as shown in FIG. 6, in the memory device 50, the vertical thermal transmission structure VT located within the vertical thermal transmission region U3 is disposed at the opposite short sides (i.e., the non-facing sides) of the semiconductor dies 210, 310, 410. In yet alternative embodiments, as shown in FIG. 7, in the memory device 60, the vertical thermal transmission structure VT located within the vertical thermal transmission region U3 is disposed at the non-facing long sides of the semiconductor dies 210, 310, 410.

In accordance with some embodiments of the disclosure, a memory device includes a first semiconductor die and a memory cube mounted on and connected with the first semiconductor die. The memory cube includes multiple stacked tiers, and each tier of the multiple stacked tiers includes second semiconductor dies laterally wrapped by an encapsulant and a redistribution structure disposed on the second semiconductor dies and the encapsulant. The second semiconductor dies of the multiple stacked tiers are electrically connected with the first semiconductor die through the redistribution structures in the multiple stacked tiers. Each redistribution structure in the multiple stacked tiers includes redistribution patterns, the redistribution structure closest to the first semiconductor die further includes a thermally conductive layer connected to the first semiconductor die, wherein a material of the redistribution patterns in the multiple stacked tiers is different from a material of the thermally conductive layer of the redistribution structure closest to the first semiconductor die, and the thermally conductive layer is electrically isolated from the second semiconductor dies in the multiple stacked tiers and the first semiconductor die.

In accordance with some embodiments of the disclosure, a memory device includes a logic die, a memory cube mounted on and connected with the logic die through connectors, and a molding compound laterally wrapping the memory cube and wrapping around the connectors. The memory cube includes a first tier, at least one second tier and a third tier, the at least one second tier is located between the first tier and the third tier, the first tier is closest to the logic die, and each of the first tier, the at least one second tier and the third tier includes semiconductor dies laterally wrapped by an encapsulant and a redistribution structure disposed on the semiconductor dies and the encapsulant. The semiconductor dies of the memory cube are electrically connected with the logic die through the redistribution structures of the memory cube, the redistribution structure of the first tier includes a thermally conductive layer connected to the logic die, the thermally conductive layer of the first tier extends laterally beyond spans of the semiconductor dies in the first tier, and the thermally conductive layer of the first tier is electrically isolated from the semiconductor dies of the memory cube and the logic die.

In accordance with some embodiments of the disclosure, a method includes at least the following steps is provided. First redistribution patterns are formed in a first dielectric layer. Second redistribution patterns electrically connected with the first redistribution patterns are formed on the first dielectric layer with a first material. A thermally conductive layer electrically isolated from the first redistribution patterns and the second redistribution patterns is formed over the first dielectric layer with a second material different form the first material. A second dielectric layer is formed over the first dielectric layer, wherein the second redistribution patterns and the thermally conductive layer are embedded in the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a first semiconductor die; and
 a memory cube, mounted on and connected with the first semiconductor die, wherein the memory cube includes multiple stacked tiers, each tier of the multiple stacked tiers includes:
  second semiconductor dies laterally wrapped by an encapsulant; and
  a redistribution structure disposed on the second semiconductor dies and the encapsulant, wherein the second semiconductor dies of the multiple stacked tiers are electrically connected with the first semiconductor die through the redistribution structures in the multiple stacked tiers, each redistribution structure in the multiple stacked tiers includes redistribution patterns, the redistribution structure closest to the first semiconductor die further includes a thermally conductive layer connected to the first semiconductor die, a material of the redistribution patterns in the multiple stacked tiers is different from a material of the thermally conductive layer of the redistribution structure closest to the first semiconductor die, and the thermally conductive layer is electrically isolated from the second semiconductor dies in the multiple stacked tiers and the first semiconductor die.

2. The memory device of claim 1, wherein the material of the thermally conductive layer in the redistribution structure closest to the first semiconductor die has a maximum thermal conductivity along a plane substantially perpendicular to a stacking direction of the multiple stacked tiers.

3. The memory device of claim 1, wherein the material of the thermally conductive layer in the redistribution structure closest to the first semiconductor die includes graphene.

4. The memory device of claim 1, wherein the memory cube includes a vertical thermal transmission structure vertically extending through the multiple stacked tiers along a stacking direction of the multiple stacked tiers and connected to the thermally conductive layer, the vertical thermal transmission structure has a thermal conductivity larger than that of the encapsulant, and the vertical thermal transmission structure is electrically isolated from the second semiconductor dies in the multiple stacked tiers and the first semiconductor die.

5. The memory device of claim 4, wherein the multiple stacked tiers include a topmost tier, a bottommost tier, and a middle tier between the topmost tier and the bottommost tier, the bottommost tier is located between the middle tier and the first semiconductor die, the vertical thermal transmission structure includes thermally conductive vias located in the middle tier and the bottommost tier, and each second semiconductor die in the topmost tier connect the vertical thermal transmission structure.

6. The memory device of claim 5, wherein the memory cube includes a vertical signal transmission structure vertically extending through the multiple stacked tiers along the stacking direction of the multiple stacked tiers, the vertical signal transmission structure is electrically connected with the second semiconductor dies in the multiple stacked tiers and the first semiconductor die, the vertical thermal transmission structure includes through insulator vias located in the middle tier and the bottommost tier, and a material of the thermally conductive vias is substantially the same as a material of the through insulator vias.

7. The memory device of claim 5, wherein the second semiconductor dies in the topmost tier are spaced apart by a first distance, the second semiconductor dies in the middle tier are spaced apart by a second distance, the second semiconductor dies in the bottommost tier are spaced apart by a third distance, the first distance is smaller than the second distance and the third distance.

8. A memory device, comprising:
a logic die;
a memory cube, mounted on and connected with the logic die through connectors, wherein the memory cube includes a first tier, at least one second tier, and a third tier, the at least one second tier is located between the first tier and the third tier, the first tier is closest to the logic die, and each of the first tier, the at least one second tier and the third tier includes:
semiconductor dies laterally wrapped by an encapsulant; and
a redistribution structure disposed on the semiconductor dies and the encapsulant, wherein the semiconductor dies of the memory cube are electrically connected with the logic die through the redistribution structures of the memory cube, the redistribution structure of the first tier includes a thermally conductive layer connected to the logic die, the thermally conductive layer of the first tier extends laterally beyond spans of the semiconductor dies in the first tier, and the thermally conductive layer of the first tier is electrically isolated from the semiconductor dies of the memory cube and the logic die; and
a molding compound, laterally wrapping the memory cube and wrapping around the connectors.

9. The memory device of claim 8, wherein the material of the thermally conductive layer in the first tier has a maximum thermal conductivity along a plane substantially perpendicular to a stacking direction of the first tier, the at least one second tier and the third tier.

10. The memory device of claim 8, wherein the material of the thermally conductive layer in the first tier includes graphene.

11. The memory device of claim 8, wherein the memory cube has a vertical signal transmission region and a lateral thermal transmission region, the lateral thermal transmission region surrounds and is spaced apart from the vertical signal transmission region, and the thermally conductive layer of the first tier is located within the lateral thermal transmission region.

12. The memory device of claim 11, wherein each of the at least one second tier and the first tier includes through insulator vias laterally wrapped by the encapsulant and located within the vertical signal transmission region, and the through insulator vias in the memory cube electrically connect the semiconductor dies in the memory cube with the logic die through the redistribution structures in the memory cube.

13. The memory device of claim 11, wherein the memory cube further has a vertical thermal transmission region overlapped with the lateral thermal transmission region and located at outer edges of the lateral thermal transmission region.

14. The memory device of claim 13, wherein each of the at least one second tier and the first tier includes thermally conductive vias laterally wrapped by the encapsulant and located within the vertical thermal transmission region, wherein the thermally conductive vias in the memory cube are connected with the thermally conductive layer.

15. The memory device of claim 14, wherein portions of the semiconductor dies in the third tier are located within the vertical thermal transmission region, and the thermally conductive vias in the memory cube are connected to the portions of the semiconductor dies in the third tier.

16. The memory device of claim 8, wherein the thermally conductive layer has a mesh pattern.

* * * * *